(12) United States Patent
Kaviani

(10) Patent No.: US 8,294,490 B1
(45) Date of Patent: Oct. 23, 2012

(54) INTEGRATED CIRCUIT AND METHOD OF ASYNCHRONOUSLY ROUTING DATA IN AN INTEGRATED CIRCUIT

(75) Inventor: Alireza S. Kaviani, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 7 days.

(21) Appl. No.: 12/896,718

(22) Filed: Oct. 1, 2010

(51) Int. Cl.
*H01L 25/00* (2006.01)
*H03K 19/00* (2006.01)

(52) U.S. Cl. .......................... 326/41; 326/101

(58) Field of Classification Search .............. 326/37–41, 326/47
See application file for complete search history.

(56) References Cited

U.S. PATENT DOCUMENTS

| | | | |
|---|---|---|---|
| 4,533,994 A | 8/1985 | Harrill et al. | |
| 4,631,698 A | 12/1986 | Walsh et al. | |
| 5,208,491 A | 5/1993 | Ebeling et al. | |
| 5,261,083 A | 11/1993 | Witkowski et al. | |
| 5,367,209 A | 11/1994 | Hauck et al. | |
| 5,490,119 A | 2/1996 | Sakurai et al. | |
| 5,675,524 A | 10/1997 | Bernard | |
| 5,787,007 A | 7/1998 | Bauer | |
| 6,081,473 A * | 6/2000 | Agrawal et al. | 365/230.01 |
| 6,195,361 B1 | 2/2001 | Kondoh et al. | |
| 6,201,404 B1 | 3/2001 | Reddy et al. | |
| 6,486,709 B2 | 11/2002 | Sutherland et al. | |
| 6,522,170 B1 | 2/2003 | Durham et al. | |
| 6,529,042 B1 * | 3/2003 | Hiramoto et al. | 326/83 |
| 6,590,424 B2 | 7/2003 | Singh et al. | |
| 6,842,046 B2 | 1/2005 | Tzartzanis et al. | |
| 6,958,627 B2 | 10/2005 | Singh et al. | |
| 7,088,627 B1 | 8/2006 | Bajwa et al. | |
| 7,100,168 B1 | 8/2006 | Wenzl | |
| 7,102,385 B2 | 9/2006 | Plants et al. | |
| 7,154,299 B2 | 12/2006 | Swami et al. | |
| 7,157,934 B2 | 1/2007 | Teifel et al. | |
| 7,342,415 B2 | 3/2008 | Teig et al. | |
| 7,408,381 B1 | 8/2008 | Drimer et al. | |
| 7,500,043 B2 * | 3/2009 | Wood | 710/307 |
| 7,504,851 B2 | 3/2009 | Manohar et al. | |
| 7,505,304 B2 | 3/2009 | Manohar et al. | |
| 7,521,958 B2 | 4/2009 | Hutchings et al. | |
| 7,545,177 B1 * | 6/2009 | Kao et al. | 326/95 |
| 7,605,604 B1 | 10/2009 | Young | |
| 7,613,853 B2 | 11/2009 | Chauhan et al. | |
| 7,635,989 B1 | 12/2009 | Young | |

(Continued)

OTHER PUBLICATIONS

Yin, Ming; Ghovanloo, Maysam; A clockless ultra low-noise low-power wireless implantable neural recording system May 18, 2008. Circuits and Solutions 2008, IEEE International. ISBN 978-1-4244-1683-7, pp. 1756-1759.*

(Continued)

*Primary Examiner* — Shawki Ismail
*Assistant Examiner* — Dylan White
(74) *Attorney, Agent, or Firm* — John J. King

(57) ABSTRACT

An integrated circuit enabling asynchronous data communication is disclosed. The integrated circuit comprises a plurality of circuit blocks, each circuit block of the plurality of circuit blocks comprising programmable resources; and a routing network coupled to each circuit block of the plurality of circuit blocks, the routing network enabling asynchronous data communication with the plurality of circuit blocks. Each circuit block of the plurality of circuit blocks synchronously processes data received from the routing network. A method of routing data in an integrated circuit is also disclosed.

20 Claims, 20 Drawing Sheets

U.S. PATENT DOCUMENTS

| | | | |
|---|---|---|---|
| 7,714,610 B2 * | 5/2010 | He | 326/41 |
| 7,733,123 B1 | 6/2010 | Young et al. | |
| 7,743,175 B1 | 6/2010 | Young et al. | |
| 7,746,101 B1 | 6/2010 | Young | |
| 7,746,102 B1 | 6/2010 | Young et al. | |
| 7,746,103 B1 | 6/2010 | Gaide et al. | |
| 7,746,104 B1 | 6/2010 | Gaide et al. | |
| 7,746,105 B1 | 6/2010 | Gaide et al. | |
| 7,746,106 B1 | 6/2010 | Gaide et al. | |
| 7,746,108 B1 | 6/2010 | Young et al. | |
| 7,746,109 B1 | 6/2010 | Young et al. | |
| 7,746,110 B1 | 6/2010 | Gaide et al. | |
| 7,746,111 B1 | 6/2010 | Gaide et al. | |
| 7,746,112 B1 | 6/2010 | Young et al. | |
| 7,746,113 B1 | 6/2010 | Young | |
| 7,759,974 B1 | 7/2010 | Young | |
| 2005/0021749 A1 * | 1/2005 | Donlin et al. | 709/225 |
| 2005/0040846 A1 | 2/2005 | Otsuka et al. | |
| 2007/0188211 A1 | 8/2007 | Kim | |
| 2007/0256038 A1 | 11/2007 | Manohar | |
| 2008/0168407 A1 | 7/2008 | Manohar | |
| 2009/0085552 A1 * | 4/2009 | Franza et al. | 323/350 |
| 2010/0007376 A1 | 1/2010 | Redgrave | |
| 2010/0281448 A1 * | 11/2010 | He | 716/6 |

OTHER PUBLICATIONS

U.S. Appl. No. 12/417,046, filed Apr. 2, 2009, Young et al.
U.S. Appl. No. 12/417,007, filed Apr. 2, 2009, Young et al.
U.S. Appl. No. 12/417,010, filed Apr. 2, 2009, Young.
U.S. Appl. No. 12/417,012, filed Apr. 2, 2009, Young.
U.S. Appl. No. 12/417,048, filed Apr. 2, 2009, Young et al.
U.S. Appl. No. 12/417,051, filed Apr. 2, 2009, Young et al.
U.S. Appl. No. 12/896,742, filed Oct. 1, 2009, Kaviani.
U.S. Appl. No. 12/896,720, filed Oct. 1, 2009, Kaviani.
Achronix Semiconductor Corp., *Introduction to Achronix FPGAs*, WP001 Rev. 1.6, Aug. 7, 2008, pp. 1-7, available from Achronix Semiconductor Corp., San Jose, California, USA.
Achronix Semiconductor Corp., *Speedster FPGA Family*, PB001 v3.5, copyright 2008, pp. 1-2, available from Achronix Semiconductor Corp., San Jose, California, USA.
Borriello, F. et al., "The Triptych FPGA Architecture," *IEEE Transactions on Very Large Scale Integration (VLSI)Systems*, Dec. 1990, pp. 491-501, vol. 3, No. 4.
Feng, T. et al., "Fault Tolerant Clockless Wave Pipeline Design," *Proc. of the 1st Conference on Computer Frontiers*, Apr. 14, 2004, pp. 1-17, ACM, New York, New York, USA.
Ferretti, Marcos et al., "Single-Track Asynchronous Pipeline Templates Using 1-of-N Encoding," *Proc. of the Conference on Design, Automation and Test in Europe*, Mar. 4, 2002, pp. 1-8, IEEE Computer Society, Washington, DC, USA.
Hauck, Scott et al., "Montage: An FPGA for Synchronous and Asynchronous Circuits," *Field-Programmable Gate Arrays: Architecture and Tools for Rapid Prototyping*, 1999, pp. 44-51, publ. by Springer Verlag, Berlin, Germany.
Hauck, Scott et al., "An FPGA for Implementing Asynchronous Circuits," *IEEE Design and Test of Computers*, Fall 1994, pp. 60-69, vol. 11, No. 3.
Hauck, Scott, "Asynchronous Design Methodologies: An Overview," *Proc. of the IEEE*, Jan. 1995, pp. 69-93, vol. 83, No. 1.
Hauser, John, *The Garp Architecture*, Oct. 1997, pp. 1-56, University of California at Berkeley, USA.
Huang, Randy, *Hardware-Assisted Fast Routing for Runtime Reconfigurable Computing*, Fall 2004, pp. 1-43, dissertation submitted to University of California at Berkeley, USA.
Martin, Alain et al., "The Design of an Asynchronous Microprocessor," *Proc. Decennial Caltech Conference on VLSI*, Mar. 20-22, 1989, pp. 1-23.
Payne, R., "Asynchronous FPGA Architecture," *IEE Proc.-Comput. Digit. Tech.*, Sep. 1996, pp. 282-286, vol. 143, No. 5.
Sparso, J., *Asynchronous Circuit Design—A Tutorial*, copyright 2006, pp. 1-179, available from the Technical University of Denmark, Kgs. Lyngby, Denmark.
Teifel, John et al., "Highly Pipelined Asynchronous FPGAs," *Proc. of the 2004 ACM-SIGDA International Symposium on Field Programmable Gate Arrays*, Feb. 22-24, 2004, pp. 133-142, Monterey, California, USA.
Tsu, William et al., "High-Speed, Hierarchical Synchronous Reconfigurable Array," *Proc. of the 1999 ACM/SIGDA 7th International Symposium on Field Programmable Gate Arrays*, Feb. 21-23, 1999, pp. 125-134, Monterey, California, USA.
Wikipedia, "C-element," downloaded Jul. 17, 2008 from http://en.wikipedia.org/C-element, pp. 1-2.
Ye, A. et al., "Measuring and utilising the correlation between signal connectivity and signal positioning for FPGAs containing multi-bit building blocks," *IEE Proc.-Comput. Digit. Tech.*, May 2006, pp. 146-156, vol. 153, No. 3.
Ye, Andy et al., "Using Bus-Based Connections to Improve Field-Programmable Gate-Array Density for Implementing Datapath Circuits," *IEEE Transactions on Very Large Scale Integrations (VLSI) Systems*, May 2006, pp. 462-473, vol. 14, No. 5.

* cited by examiner

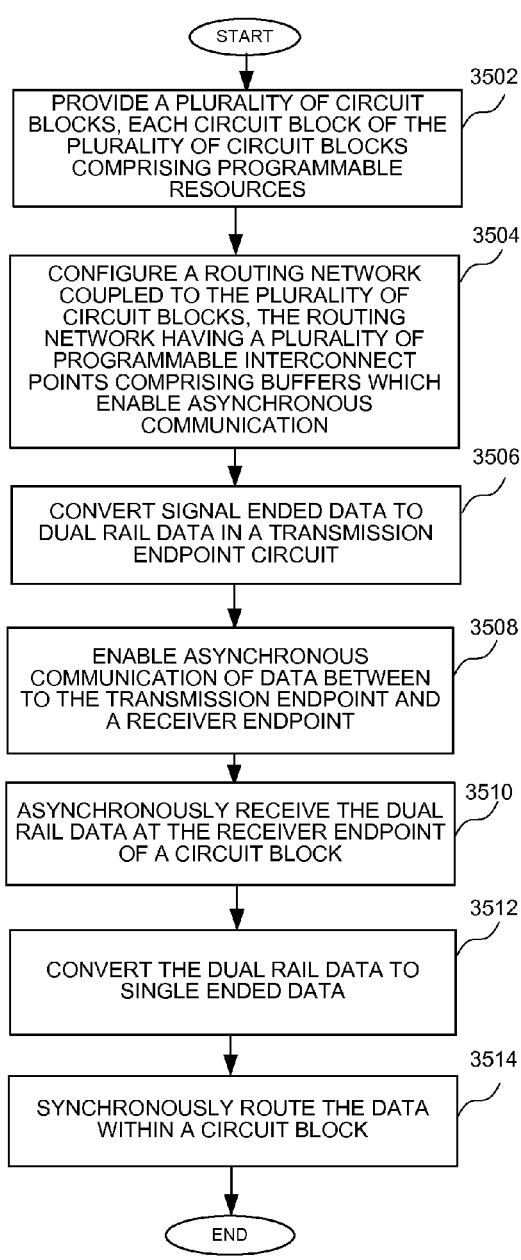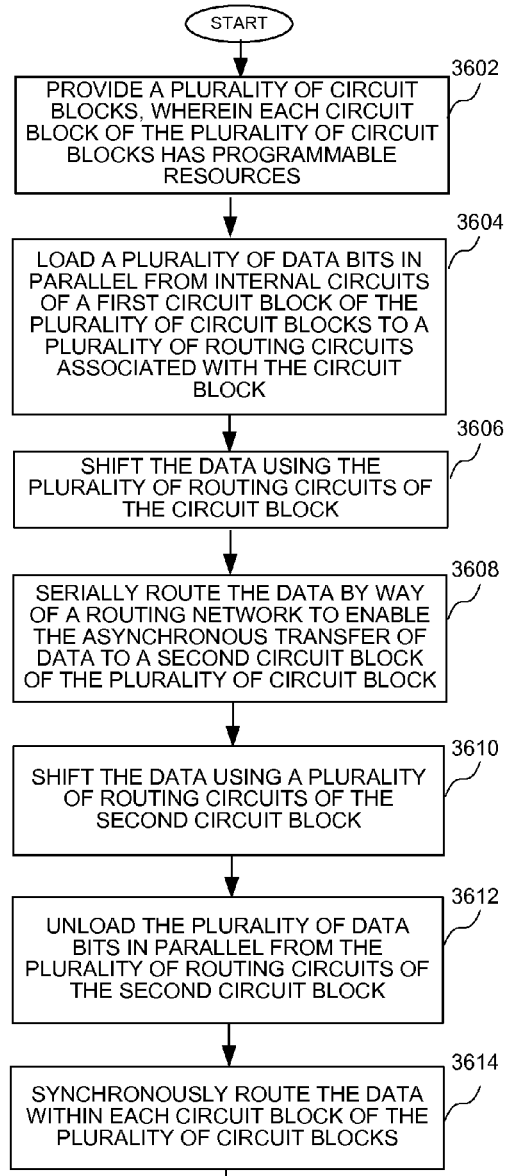
FIG. 35
FIG. 36

INTEGRATED CIRCUIT AND METHOD OF ASYNCHRONOUSLY ROUTING DATA IN AN INTEGRATED CIRCUIT

FIELD OF THE INVENTION

The present invention relates generally to integrated circuits, and in particular, to a method of asynchronously routing data in an integrated circuit.

BACKGROUND

As integrated circuits continue to evolve, the number of voltage and frequency domains is rapidly increasing. With a greater number of voltages and frequency domains, additional circuits must be implemented to accommodate the voltages and frequency domains. More complex timing control circuits are also required to enable the operation of circuits implemented in the various frequency domains.

Further, as transistors get smaller and faster, the metal conductors of an integrated circuit are not able to transfer signals fast enough in response to the faster transistor speeds. While conventional circuits may implement wider and taller conductors to increase speed, such conductors introduce other problems when implementing a circuit, such as increased capacitance or delay. Another solution to increase speed is to pipeline the data by inserting flip flops in interconnects, thereby increasing the throughput. However, such pipelining structures result in significant clock loading.

In devices having programmable resources, a significant amount of interconnects is required for programmability. Further, conventional integrated circuit devices which enable synchronous communication have high area overhead to provide the necessary clock signals. Such clocking structures also require circuits to account for skew in the communication of data over various paths in the circuit.

SUMMARY

An integrated circuit enabling asynchronous data communication is disclosed. The integrated circuit comprises a plurality of circuit blocks, each circuit block of the plurality of circuit blocks comprising programmable resources; and a routing network coupled to each circuit block of the plurality of circuit blocks, the routing network enabling asynchronous data communication with the plurality of circuit blocks. Each circuit block of the plurality of circuit blocks synchronously processes data received from the routing network.

According to some embodiments, each circuit block of the plurality of circuit blocks may comprise a power gating circuit enabling coupling power to the circuit block, and may receive a reference voltage signal of a plurality of reference voltage signals by way of the power gating circuit. Additionally or alternatively, each circuit block of the plurality of circuit blocks may receive a clock signal of a plurality of clock signals. Each circuit block of the plurality of circuit blocks may be separately addressable, and may comprise a plurality of configurable blocks. The integrated circuit may further comprise selection circuitry coupled to disable a circuit block of the plurality of circuit blocks. In some embodiments, at least one circuit block operates on a same clock domain as at least one other circuit block.

According to an alternate embodiment, an integrated circuit enabling asynchronous data communication comprises a plurality of circuit blocks, each circuit of the plurality of circuit blocks comprising programmable resources; and a routing network coupled to each circuit block of the plurality of circuit blocks, the routing network enabling asynchronous data communication with the plurality of circuit blocks. Each circuit block comprises an interface portion enabling asynchronous communication with configurable blocks of the circuit blocks.

According to some embodiments, the routing network may enable wave pipelining between circuit blocks receiving a common clock signal. The interface portion may enable clockless time multiplexing of data coupled to the circuit block. The integrated interface portion may comprise a plurality of routing circuits, where each routing circuit comprises a transmission endpoint circuit and a receiver endpoint circuit. Each circuit block of the plurality of circuit blocks may comprise a power gating circuit enabling coupling power to the circuit block, wherein each circuit block may receive a reference voltage signal of a plurality of reference voltage signals by way of the power gating circuit and may be separately addressable.

A method of routing data in an integrated circuit is also disclosed. The method comprises configuring a routing network having buffers for enabling asynchronous communication of data between a plurality of circuit blocks; asynchronously routing data between the plurality of circuit blocks of the integrated circuit using the routing network; and synchronously routing data within each circuit block of the plurality of circuit blocks.

The method may comprise loading a configuration bitstream having configuration bits for configuring the buffers to function as asynchronous buffers. The method may also comprise isolating each circuit block of the plurality of circuit blocks with a plurality of routing circuits, and asynchronously routing the data in the plurality of routing circuits. For each circuit block of the plurality of circuit blocks, a selection circuit may be provided for disabling the circuit block. A circuit block of the plurality of circuit blocks may be accessed using an address for the circuit block.

BRIEF DESCRIPTION OF THE DRAWINGS

FIG. 35 is a flow chart showing a method of asynchronously routing data in an integrated circuit according to an embodiment; and FIG. 36 is a flow chart showing a method of routing data in circuit blocks of an integrated circuit according to an embodiment.

DETAILED DESCRIPTION

Figure 1:
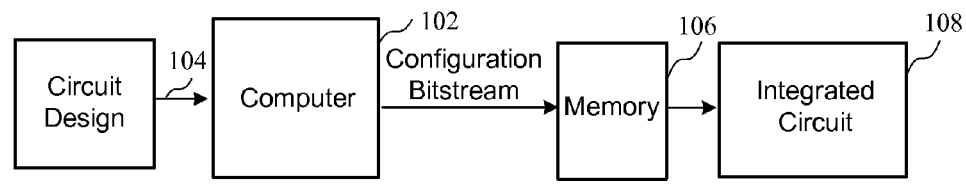
FIG. 1 is a block diagram for a system for implementing an integrated circuit having programmable resources according to an embodiment.

Turning first to FIG. 1, a block diagram for a system for implementing integrated circuits having programmable resources is shown. In particular, a computer 102 is coupled to receive a circuit design 104, and generate a configuration bitstream. The computer 102 may include a design tool for generating the configuration bitstream. An example of a design tool which could be implemented by the computer 102 is the System Generator design tool available from Xilinx, Inc., of San Jose, Calif. The configuration bitstream may be stored in a memory 106, from which it is downloaded to an integrated circuit 108. As will be described in more detail below, the integrated circuit 108 includes programmable resources which are configured based upon the configuration bitstream.

While programmable resources according to the various embodiments may be implemented in any type of integrated circuit device, such as an application specific integrated circuit (ASIC) having programmable resources, other devices generally referred to as programmable logic devices (PLDs) include a significant portion of programmable resources. A PLD is an integrated circuit designed to be user-programmable so that users may implement logic designs of their choices. One type of PLD is the Complex Programmable Logic Device (CPLD). A CPLD includes two or more "function blocks" connected together and to I/O resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream into configuration memory cells of the FPGA. However, it should be understood that the programmable resources implemented in CPLDs or FPGAs may be implemented in a portion of an ASIC.

For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell. As will be described in more detail below, the configuration bitstream enables configuring circuit elements for asynchronous communication in an integrated circuit, such as an integrated circuit having programmable resources.

Figure 2:
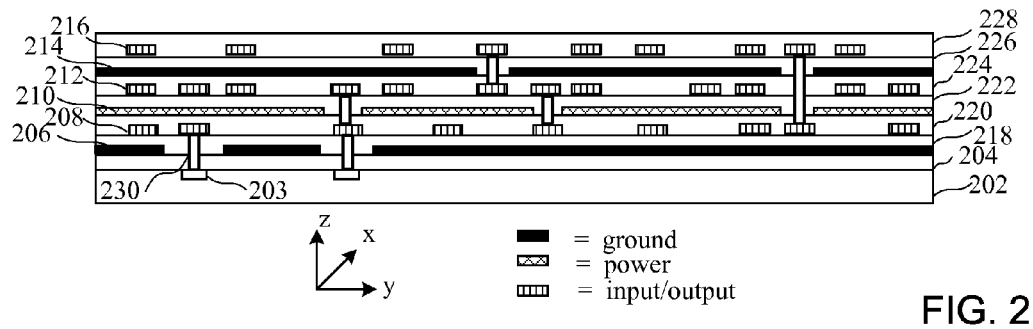
FIG. 2 is a cross-sectional view of an integrated circuit having programmable resources according to an embodiment.

Turning now to FIG. 2, a cross-sectional view of an integrated circuit according to an embodiment is shown. The cross-sectional view of FIG. 2 shows various metal layers, shown here with shading or hatching. The metal layers are built over a substrate 202 in the "z" direction according to the axial directions as shown, and are separated by insulating layers. More particularly, the substrate 202 includes circuit elements 203. The circuit elements may be passive devices such as resistors or capacitor, or active devices, such as transistors, for example. As should be apparent in the remaining description, the circuit blocks are implemented in the substrate and coupled by configurable routing resources. Referring to the particular embodiment of FIG. 2, the substrate is covered by a dielectric layer 204. Metal layers and dielectric layers are then alternately applied. As shown in FIG. 2, a plurality of metal layers 206-216 is separated by corresponding dielectric layers 218-226. A dielectric layer 228 covers the top metal layer 226. Vias 230 enable connections between various metal layers or to circuit elements implemented in the substrate, as is well known in the art.

As is shown in FIG. 2, metal layers 206, 210 and 214 include lines which extend in the "y" direction, while metal layers 208, 212 and 216 include lines which extend in the "x" direction. The various conductors implemented in the various metal layers may be power conductors, ground conductors or signaling conductors. While the cross section of FIG. 2 shows particular conductors in various layers, additional metal layers may be implemented, and the arrangement of conductors may be different. For example, multiple signals may be provided by power, ground and signaling conductors in a given layer. Further, some layers may be implemented as power or ground planes.

The exemplary layers of FIG. 2 are provided by way of example to show how different layers may be used to provide different types of interconnects between circuit elements of the integrated circuit. According to one embodiment, certain metal layers may be implemented for interconnects extending predetermined distances between circuit elements of the integrated circuit. For example, various metal layers may be implemented to enable electrical connections between various circuit blocks which are separated by a predetermined number of circuit blocks, and may be considered long lines. In contrast, other layers may be implemented to enable electrical connections between a fewer number of circuit blocks. The length of such lines would generally be shorter, and therefore would be considered short lines. Some metal layers may also be used for local interconnects, which provides connections of elements within a given circuit block. Circuits for enabling the input/output of data and the routing of the data within an integrated circuit are described in detail in reference to FIGS. 3-5.

As will be described in more detail below, an integrated circuit provides circuit blocks which are implemented as "islands." The circuit blocks may both provide a particular function and communicate with other circuit blocks. Various arrangements of circuit blocks and signaling associated with circuit blocks are provided in FIGS. 6-14. While the circuit blocks may enable the synchronous communication of data within a given circuit block, data may be communicated asynchronously between the circuit blocks. Circuits for enabling the asynchronous communication of data between the circuit blocks are described in more detail in reference to FIGS. 15-25. That is, some circuits of the various embodiments may be implemented in programmable interconnect points to enable asynchronous communication between circuit blocks of an integrated circuit. Circuits for providing isolation for a circuit block and for enabling communication between circuit blocks are described in detail in reference to FIGS. 26-33.

Figure 3:
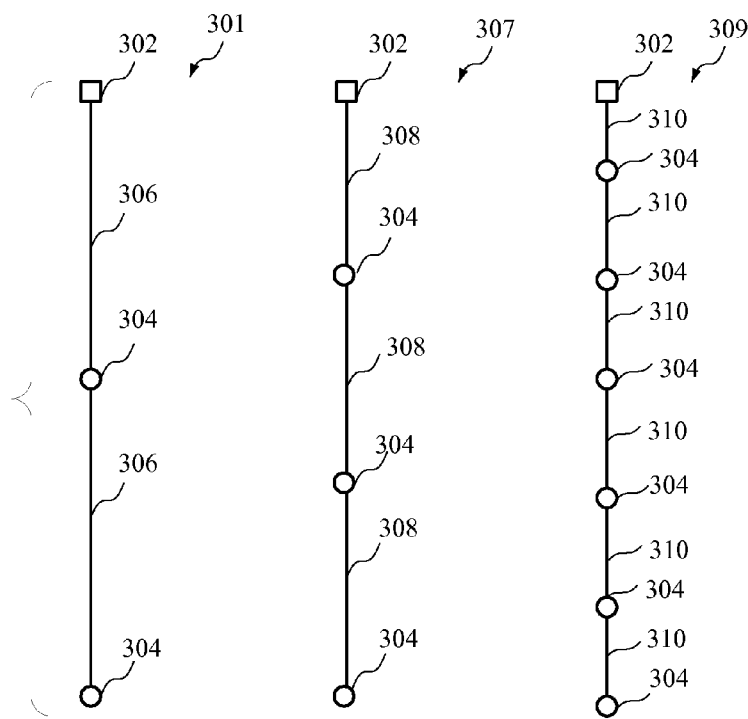
FIG. 3 is a perspective view of programmable interconnects according to an embodiment.

Turning now to FIG. 3, a perspective view of conductors of routing resources having programmable interconnects according to an embodiment is shown. In particular, portions of three different types of interconnects having programmable interconnect points extend across the same number of elements, such as circuit blocks of an integrated circuit. As described above, each of these three programmable interconnects may be implemented on different metal layers, but are shown together in FIG. 3 to provide a general relationship between the different programmable interconnects. The different types of interconnects having programmable interconnect points are shown to indicate not only that some of the types of interconnects have different functions, but that they may also be implemented with different circuits. For example, when routing resources having interconnects are used for communication within a circuit block, the programmable interconnect points may not be implemented with buffers which enable asynchronous communication. That is, because the interconnects used for communication of data within a circuit block enable synchronous communication, the programmable interconnect points would not require buffers to enable asynchronous communication. As will be described in more detail below, one embodiment includes a programmable buffer circuit which may be used in a programmable interconnect point to enable asynchronous communication in one mode and to enable synchronous communication in another mode.

A first exemplary programmable interconnect 301 includes an input/output port 302 and programmable interconnect points 304 which couple interconnects 306. According to the embodiment of FIG. 3, the interconnects 306 are referred to "hex" interconnects because they have a length which extends across 6 circuit elements of the circuit, such as 6 configurable logic elements. The interconnects 306 may also be referred to as "long lines." An input/output port 302 is shown in each of the programmable interconnects of FIG. 3 by way of example as an interconnect point at an end of an integrated circuit. However, it should be understood that portions of the programmable interconnect circuits shown in FIG. 3 implemented away from an end of the integrated circuit would include programmable interconnect points rather than input/output ports on either side of an interconnect.

A second exemplary programmable interconnect 307 includes an input/output port 302 and four programmable interconnect points 304 which are used to connect interconnects 308. The interconnects 308 are referred to as "quad" interconnects, where each quad interconnect may extend across four circuit elements of the circuit. Finally, a third exemplary programmable interconnect 309 includes an input/output ports 302 and five programmable interconnect points 304. The interconnects 310 are referred to as "double" interconnects, where each double interconnect extends across two circuit elements of the circuit. However, as can be seen, each portion of a programmable interconnect 301, 307 and 309 shown in FIG. 3 would extend across twelve circuit elements. While the programmable interconnect points 304 included in FIG. 3 show the connection of an input from one interconnect and an output to another interconnect, it will be understood that the programmable interconnect points 304 enable the routing of a signal from multiple inputs, as will be described in more detail in reference to FIG. 5. Further, it should be understood that other arrangements of programmable interconnects could be employed. As will be described in more detail below, buffer circuits which enable asynchronous communication may be used with certain programmable interconnect points.

Figure 4:
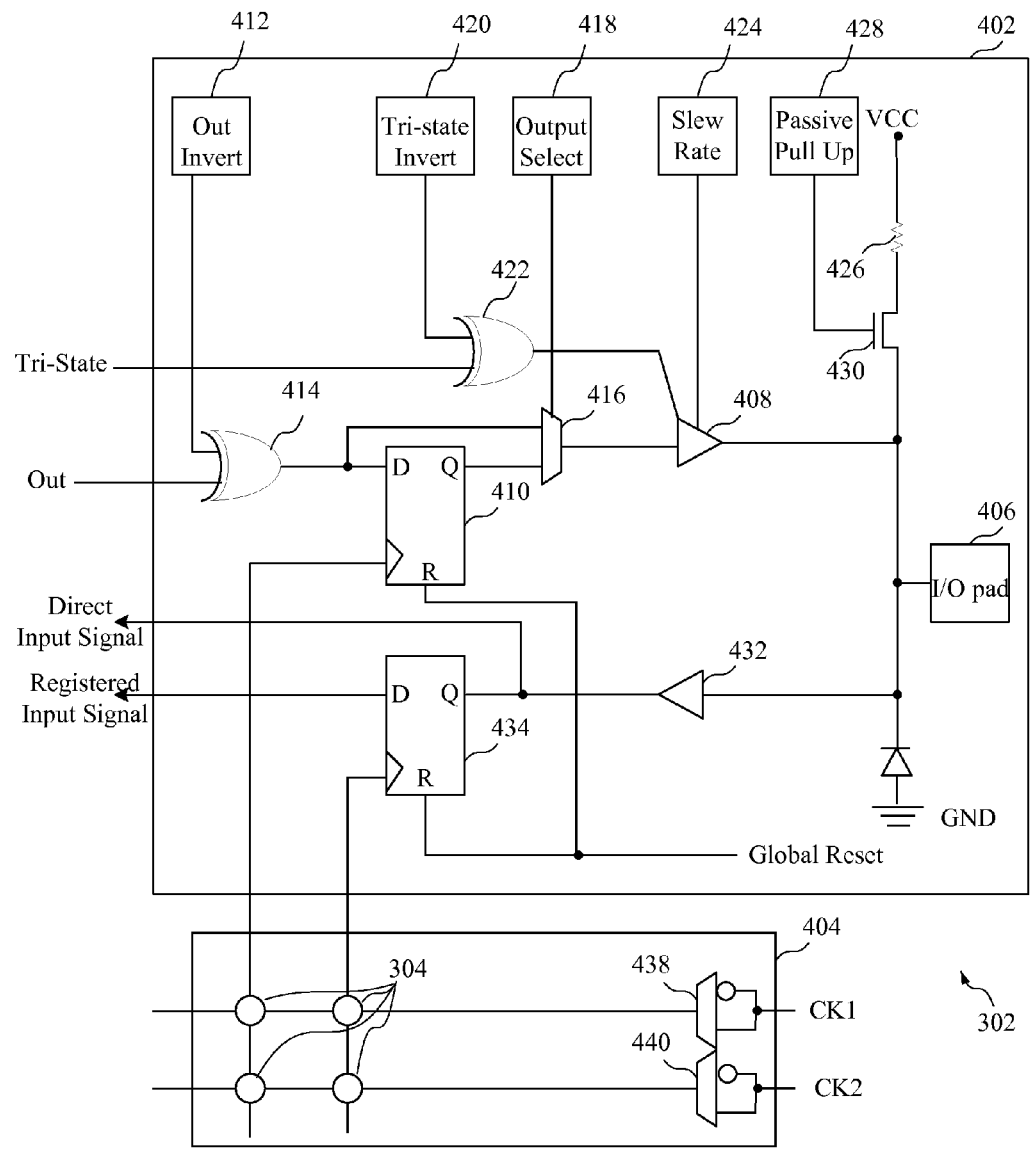
FIG. 4 is a block diagram of an input/output (I/O) port according to an embodiment.

Before describing the buffering of data in programmable interconnect points to enable the asynchronous transmission of data, a block diagram of an I/O port as shown in FIG. 4 will be described. The I/O port 302 includes an I/O portion 402 and a clock control portion 404. The I/O portion 402 includes an I/O pad 406 for receiving an input signal or generating an output signal. The I/O port 302 also includes a tri-state output driver 408 that may be driven directly or by a register 410. The polarities of both the output data and the tri-state control signal may be determined by configuration bits. In particular, an output data bit (Out) and an output invert control bit 412 are coupled to an exclusive OR (XOR) gate 414. The output of the XOR gate is coupled to the input of the register 410 or directly to a multiplexer 416. An output select control bit 418 is coupled to control the multiplexer 416 to enable the multiplexer to select either the output of the register 410 or the output of the XOR gate 414. The output may also be tri-stated. In order to enable the tri-stating of the output driver 408, a tri-state signal and a tri-state invert bit 420 are coupled to an XOR gate 422, the output of which controls the output driver 408. Each output buffer may also be configured to have either a fast or a slow slew rate according to a slew rate bit 424.

Additionally, the I/O portion 404 may be configured as a latch. When an I/O port is used exclusively as an input, an optional pull-up resistor 426 may be selected by way of a passive pull-up bit 428 and coupled to the gate of a transistor 430. The resistor 426 is decoupled when the I/O block is configured as an output or as a bidirectional I/O block. The I/O pad 406 is also coupled to an input driver 432, the output of which is coupled to a register 434. Accordingly, a direct input signal or a registered input signal may be generated. The values of output invert control bit 412, output select control bit 418, tri-state invert bit 420, slew rate bit 424, and passive pull up bit 428 may stored in configuration memory elements which are set by configuration bits of a configuration bitstream.

The clock control portion 403 includes a first multiplexer 438 coupled to receive a first clock (CK1) and an inverted first clock, and a second multiplexer 440 coupled to receive a second clock (CK2) and a inverted second clock. Programmable interconnect points 304 enable routing a desired clock signal of the various clock signals to the registers 410 and 434. While the circuit of FIG. 4 shows one example of an I/O port which may be implemented, it should be understood that other I/O ports or variations of the I/O port of FIG. 4 may be implemented.

Figure 5:
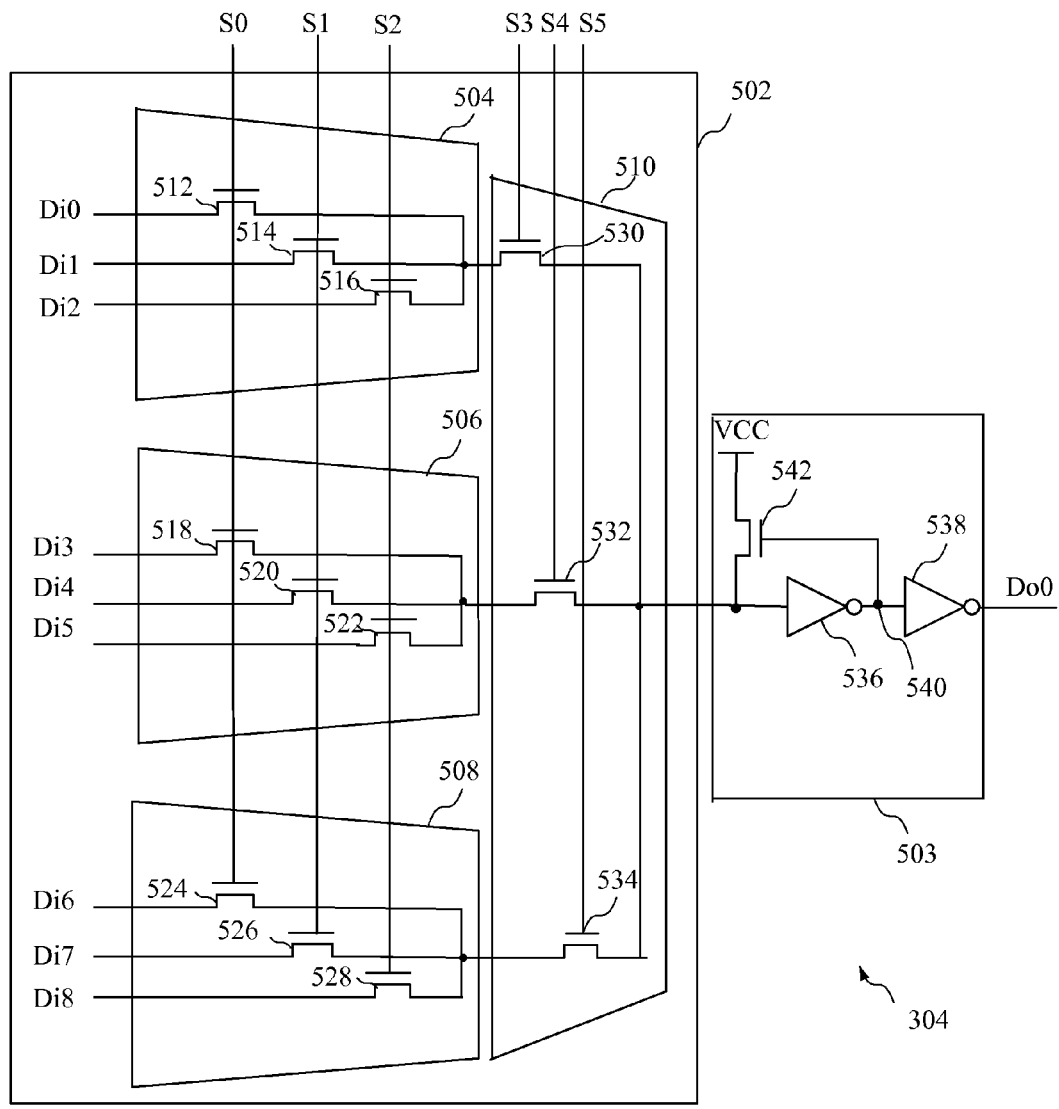
FIG. 5 is a block diagram of a programmable interconnect point (PIP) according to an embodiment.

Turning now to FIG. 5, the programmable interconnect point 304 according to an embodiment is shown. The programmable interconnect point 304 includes a multiplexer portion 502 and an output buffer 503. As shown in FIG. 5, each programmable interconnect point 304 may include a nine-to-one multiplexer which is coupled to select one of the inputs Di0 to Di8 as an output. However, it should be understood that a nine-to-one multiplexer is provided by way of example, and that other arrangements of multiplexer circuits could be provided depending upon the configuration of circuit elements of the integrated circuit. The multiplexer portion 502 includes a first stage having multiplexers 504, 506, and 508, and a second stage having a multiplexer 510. Select signals S0-S5 control the multiplexers. Select signals S0-S2 select an output for each multiplexer 504-508 of the first stage of the multiplexer portion 502. In particular, select signals S0-S2 are coupled to the gates of transistors 512-516, respectively, to select one of the inputs Di0-Di2. Select signals S0-S2 are also coupled to the gates of transistors 518-522, respectively, to select one of the inputs Di3-Di5. Finally, select signals S0-S2 are coupled to the gates of transistors 524-528, respectively, to select one of the inputs Di6-Di8. Multiplexer 510 in the second stage receives select signals S3-S5 at the gates of transistors 530-534, respectively, to select the output of one of the multiplexers 504-508 as an input to the output buffer 503. The output buffer 503 is implemented as a latch comprising inverters 536 and 538 coupled in series at a node 540 which is coupled to a gate of a transistor 542. Accordingly, the programmable interconnect points 304 enables the transfer of input data from one of a number of inputs to an output as output data Do0. The output buffer 503 may be implemented to enable asynchronous data communication according to an embodiment, as will be described in more detail below in reference to FIGS. 17-19.

Figure 15:
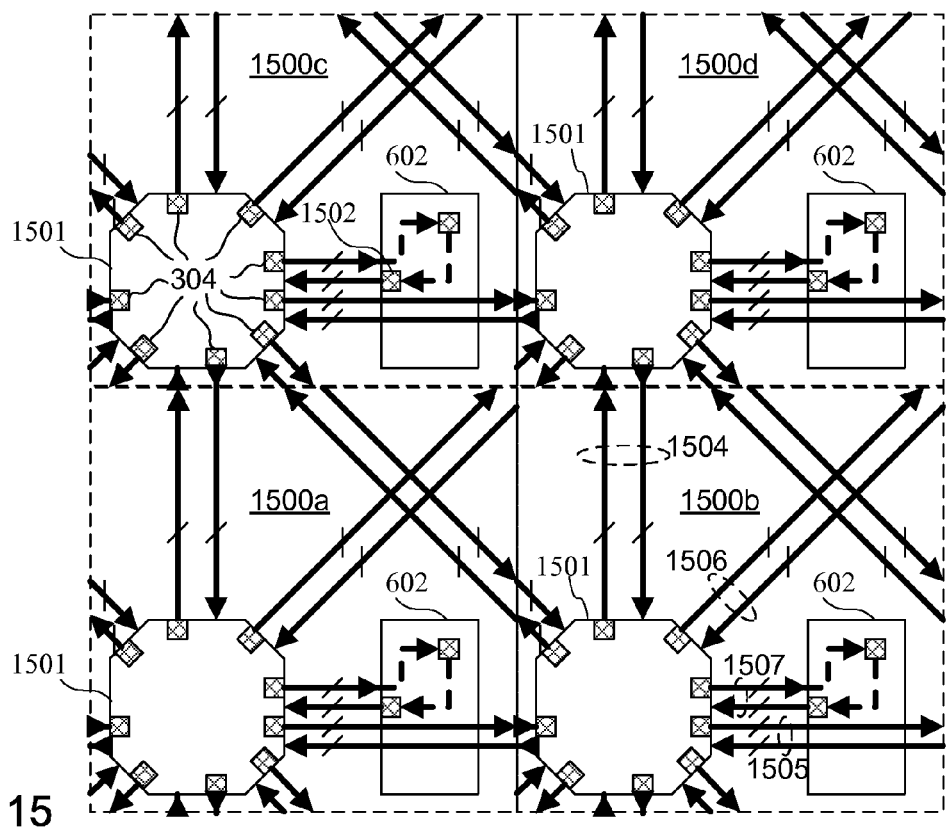
FIG. 15 is a block diagram of a portion of an integrated circuit showing the transfer of data between circuit blocks according to an embodiment.

The nine-to-one multiplexer of FIG. 5, which enables the operation of an integrated circuit architecture shown in FIG. 15, is shown by way of example. That is, the programmable interconnect points shown in FIG. 5 enable the selection of an input from one of an adjacent circuit block on each of eight "sides" of the circuit block or an output of the circuit block, as shown in the circuit arrangement of FIG. 15. However, it should be understood that other circuit arrangements of circuit blocks, and therefore other configurations of programmable interconnect points could be employed. It should further be apparent that the configuration of a programmable interconnect point may be different for enabling the communication of data within a circuit block. As will be described in more detail below, data may be transmitted as dual rail data. Accordingly, two programmable interconnect points of FIG. 5 would be implemented together to enable the dual rail data.

Figure 6:
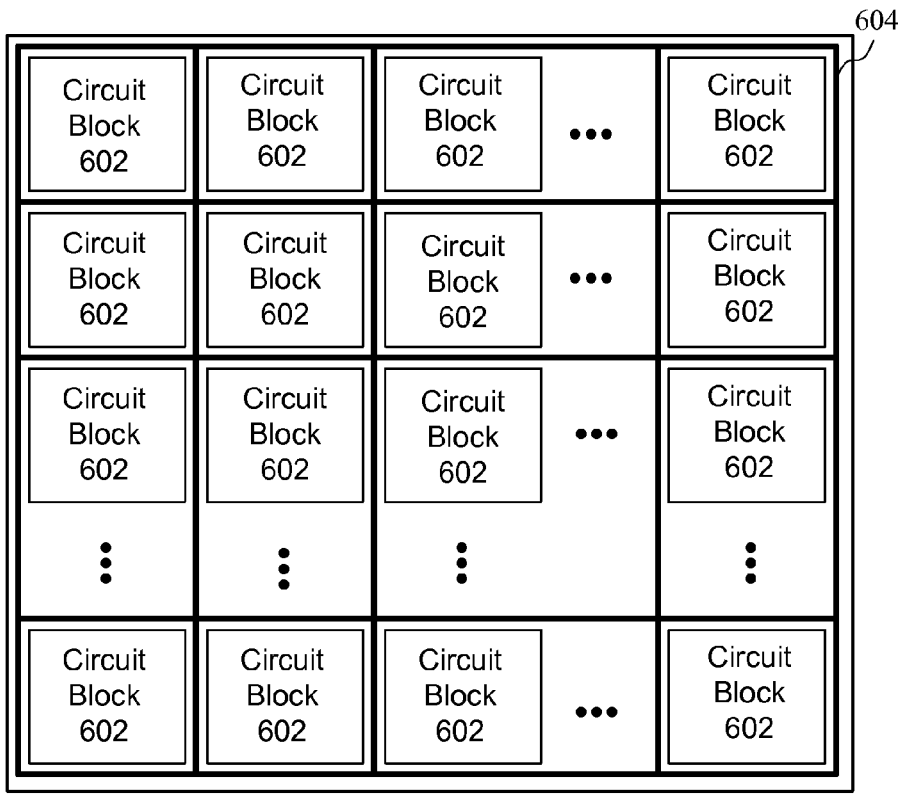
FIG. 6 is a block diagram of an integrated circuit having programmable resources according to an embodiment.

Turning now to FIG. 6, a block diagram of an integrated circuit having programmable resources according to an embodiment is shown. The number of voltage and frequency domains in advanced circuit designs implemented in integrated circuits is rapidly increasing. Various embodiments have an architecture incorporating multiple circuit blocks implemented as isolated "islands." As will be described in more detail below, each circuit block may be similar to a conventional programmable logic device, such as a CPLD or FPGA as described above. Further, the circuit blocks are coupled through an asynchronous routing network. Because the routing network provides a pipelined asynchronous interconnect network, integrated circuits implementing the routing network enable data communication at a higher bandwidth compared to conventional devices.

Figure 7:
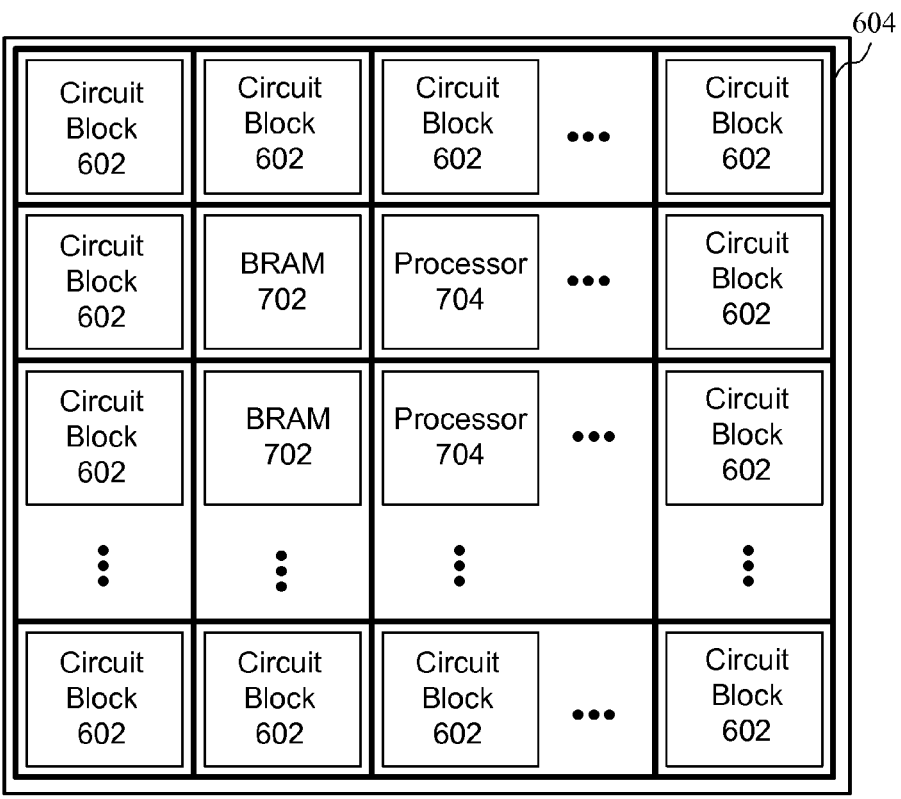
FIG. 7 is a block diagram of an integrated circuit having programmable resources according to an alternate embodiment.

As shown in the embodiment of FIG. 6, the integrated circuit includes a plurality of circuit blocks 602. Each circuit block 602 has substantially the same architecture, and may include configurable resources. As will be described in more detail below, a global routing network 604 enables asynchronous communication to the various circuit blocks of FIG. 6. According to the embodiment of FIG. 7, a matrix of individual blocks is shown, where the majority of the blocks are the circuit blocks 602. However, some of the circuit blocks may comprise specialized circuit blocks, such as blocks of random access memory (BRAMs) 702, and processor blocks 704, for example. While three types of blocks are shown in FIG. 7 by way of example, other blocks could be employed. The specialized circuit blocks are provided among the circuit blocks 602 according to the embodiment of FIG. 7 to separate out some functionality required by the integrated circuit, such as memory or processing functionality. However, the memory and processing functionality may be provided in each of the circuit blocks 602 in the embodiment of FIG. 6, obviating the need for separate specialized circuit blocks. Alternatively, in addition to the specialized circuit blocks in the embodiment of FIG. 7, the memory and processing functionality may be provided in the circuit blocks 602.

Figure 8:
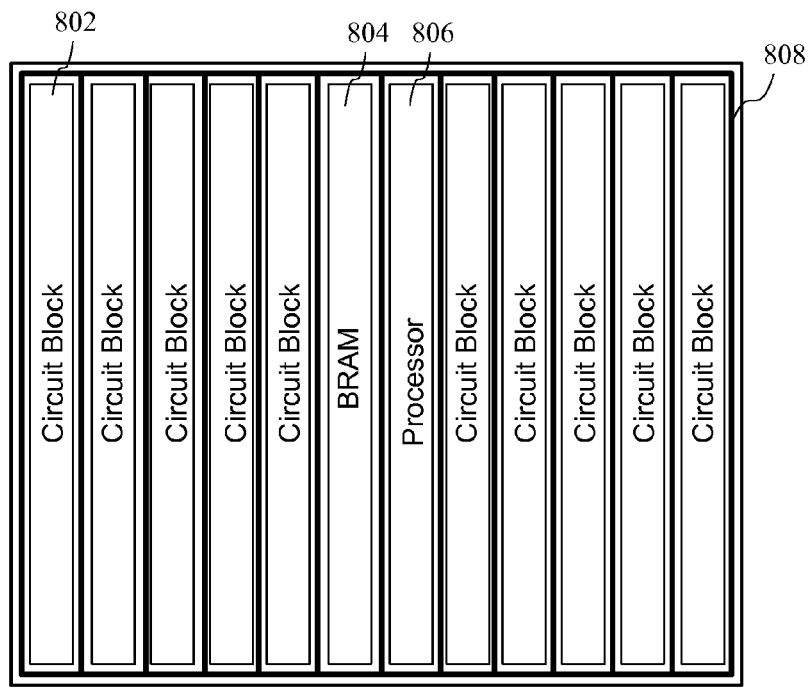
FIG. 8 is a block diagram of an integrated circuit having programmable resources implemented in a different configuration of circuit blocks according to an embodiment.

According to the embodiment of FIG. 8, columns of logical functions rather than a matrix of blocks may be employed. That is, the embodiment of FIG. 8 includes circuit block columns 802, a BRAM column 804, and a processor column 806. The global routing network 604 enables the asynchronous communication with the various columns. Additional details regarding the global routing network 604 will be described in more detail in reference to FIGS. 17-25. It should be understood that the arrangements of blocks or columns shown in FIGS. 6-8 are shown by way of example, and that other arrangements, orientations and distribution of the circuit elements could be employed.

Figure 9:
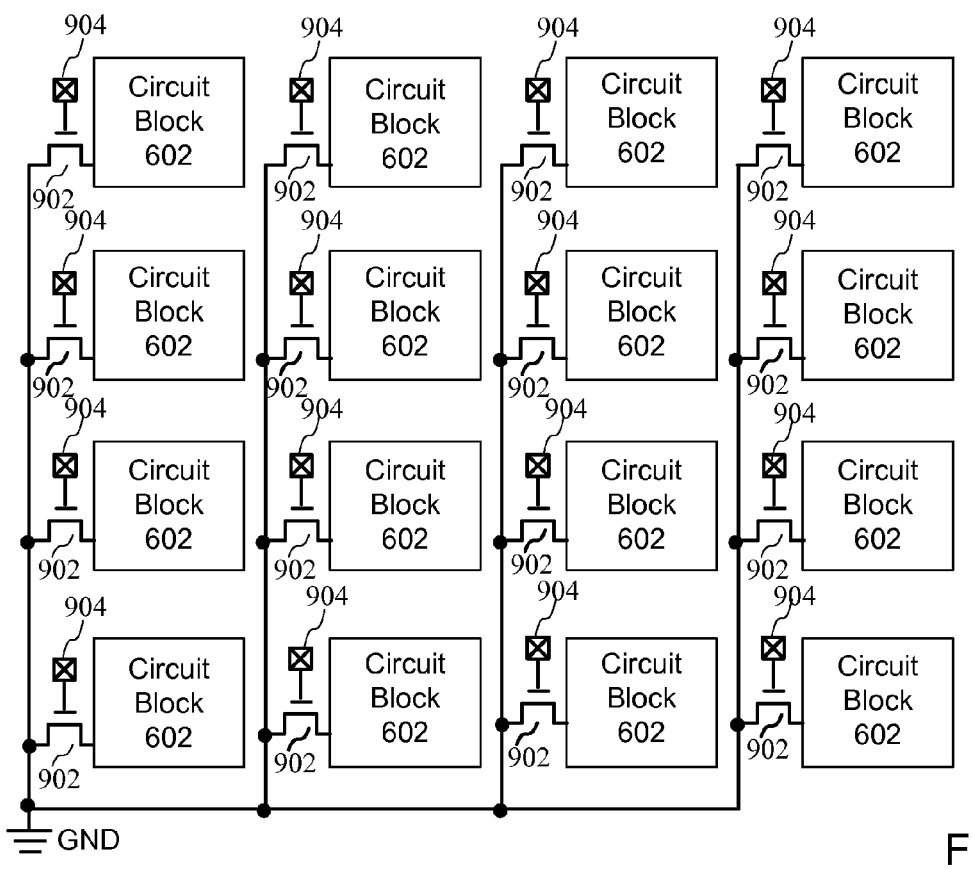
FIG. 9 is a block diagram of a circuit for power gating circuit blocks of an integrated circuit according to an embodiment.
Figure 10:
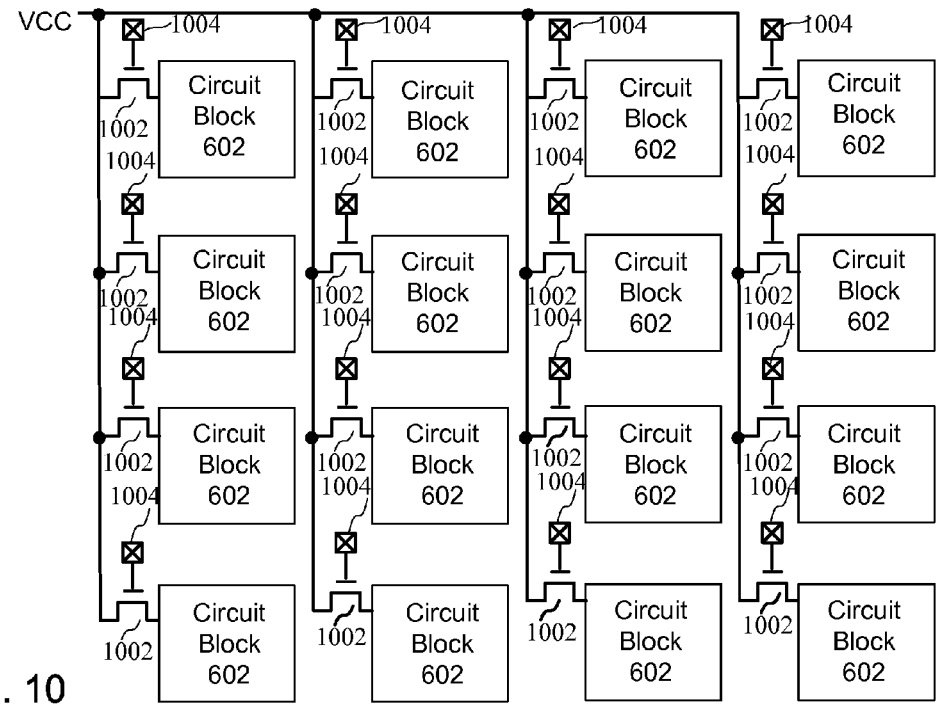
FIG. 10 is a block diagram of a circuit for power gating circuit blocks of an integrated circuit according to an alternate embodiment.

Turning now to FIGS. 9 and 10, block diagrams of circuits enabling power gating to circuit blocks of an integrated circuit are shown. Each circuit block 602 may be configured to receive a reference voltage and may have its own clocking structure. The embodiment of FIG. 9 provides a pass gate for coupling a ground potential to a circuit block, while the embodiment of FIG. 10 provides a pass gate for providing a voltage source to a circuit block. According to the embodiment of FIG. 9, each circuit block is coupled to a ground potential (GND) by way of a transistor 902 having a gate coupled to a memory element 904. Each memory element 904 stores a configuration bit provided by a configuration bitstream. Similarly, each circuit block of the embodiment of FIG. 10 is coupled to a reference voltage potential (VCC) by way of a transistor 1002. Each transistor has a gate coupled to a memory element 1004 which stores a configuration bit provided by a configuration bitstream. By setting the configuration bits of the memory elements 904 or 1004, predetermined circuit blocks 602 may be enabled or disabled. Disabling unused or defective circuit blocks conserves power and may reduce noise in the integrated circuit. While the embodiments of FIGS. 9 and 10 show circuit blocks 602, the circuit elements for decoupling a reference voltage or ground potential from a circuit block could also be applied to specialized circuit blocks, such as BRAMs or processor blocks.

Figure 11:
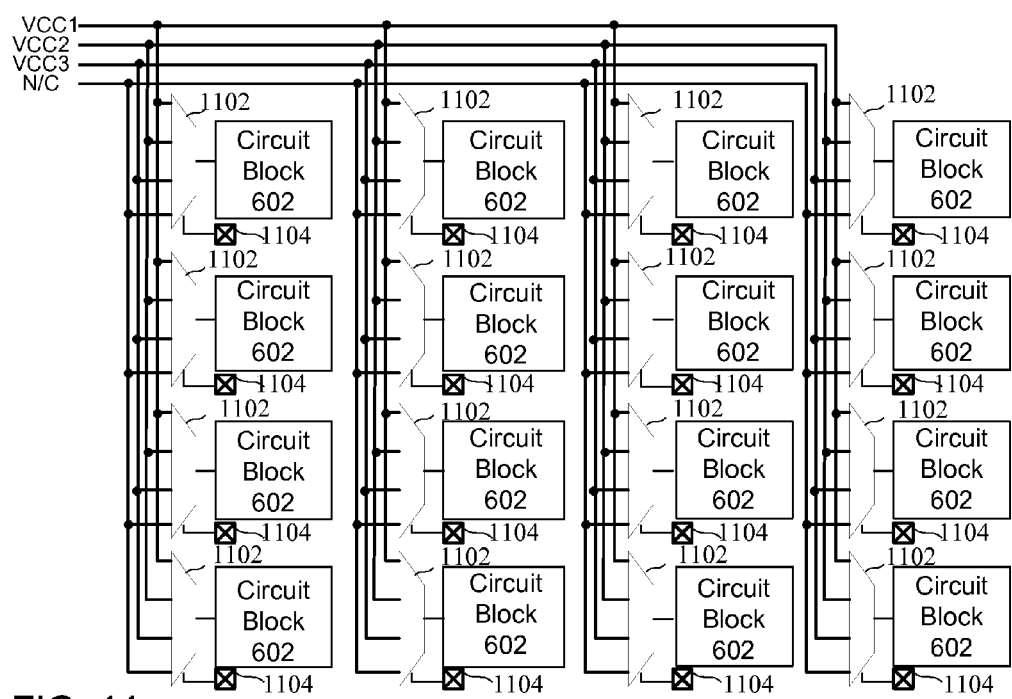
FIG. 11 is a block diagram of a circuit for coupling multiple reference voltage signals to circuit blocks of an integrated circuit according to an embodiment.
Figure 12:
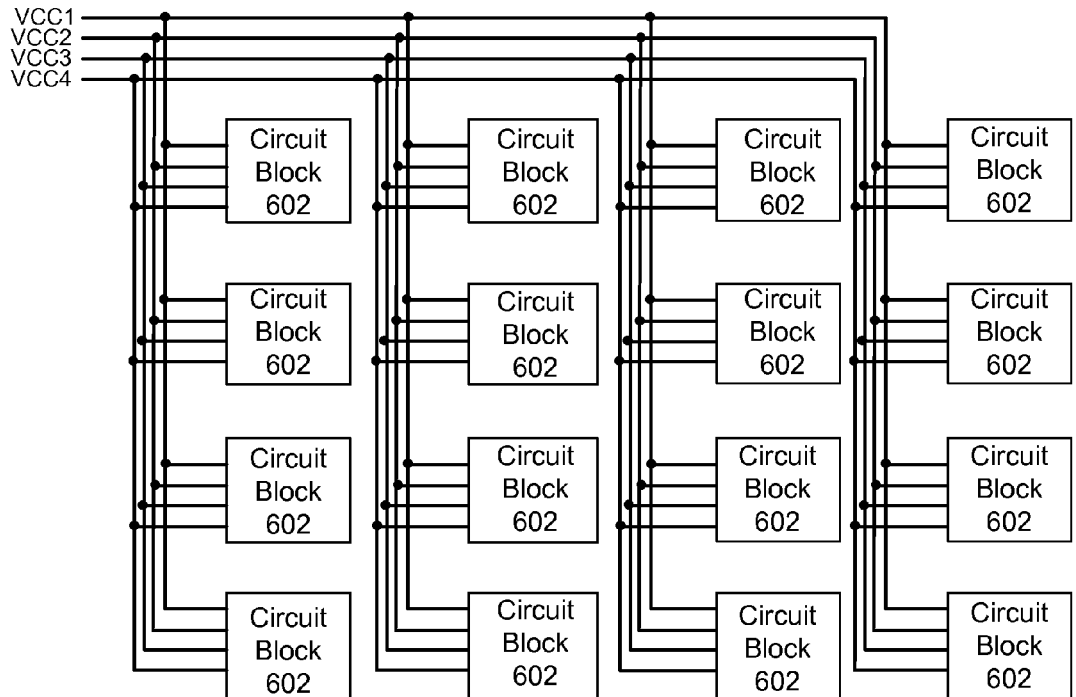
FIG. 12 is a block diagram of a circuit for coupling multiple reference voltage signals to circuit blocks of an integrated circuit according to an alternate embodiment.

According to the embodiment of FIG. 11, a circuit enables coupling one of multiple reference voltage signals or a "no connection" (NC) signal to the circuit blocks 602. Each circuit block 602 of the embodiment of FIG. 11 is coupled to a multiplexer 1102 which is controlled by a memory element 1104. Because each memory element 1104 may select between a greater number of inputs than two, each memory element 1104 may store multiple bits, and more particularly enough bits to select any one of the multiple inputs to the multiplexer 1102. According to the configuration of FIG. 11, four inputs (VCC1-VCC3 and NC) may be selected, therefore requiring two bits stored in memory element 1104. According to the embodiment of FIG. 12, each circuit block 602 may receive each of the reference voltages, shown here as reference voltages VCC1-VCC4. A local routing network associated with each circuit block of the embodiment of FIG. 12 will enable the routing of different reference voltages to appropriate portions of the circuit block.

Figure 13:
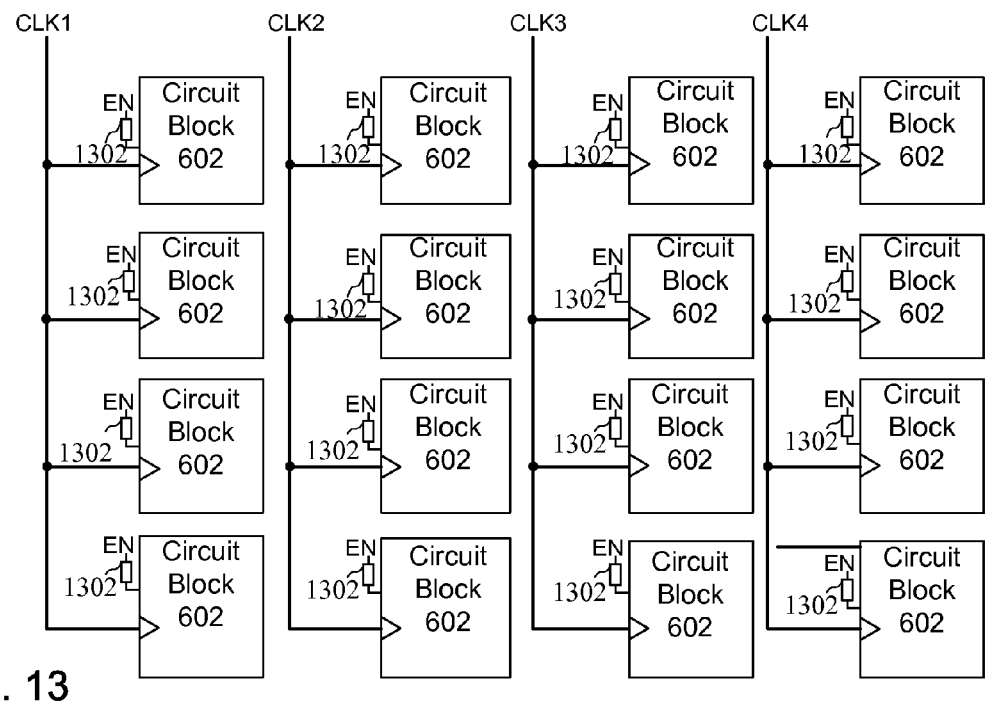
FIG. 13 is a block diagram of a circuit for coupling multiple clocks signals to circuit blocks of an integrated circuit according to an embodiment.
Figure 14:
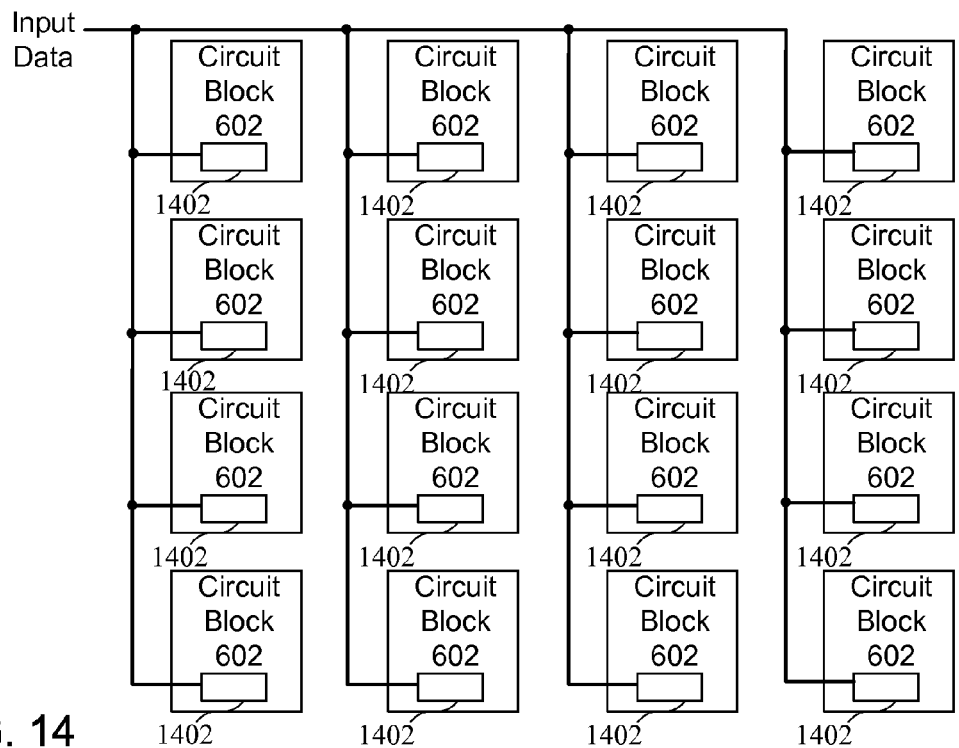
FIG. 14 is a block diagram of a circuit for providing addressable data to circuit blocks of an integrated circuit according to an embodiment.

As transistor dimensions, such as the gate width of transistors, continue to decrease, it has become more difficult to maintain a desirable yield when manufacturing integrated circuits. Because the circuit blocks 602 are power gated, redundant circuit blocks can be implemented, and defective circuit blocks disabled. Faulty circuit blocks may be disabled by using anti-fuse technology during wafer testing, for example. The anti-fuse devices may comprise CMOS compatible, one time programmable, non-volatile anti-fuse devices. The embodiment of FIG. 13 shows the coupling of different clock signals to the circuit blocks. As shown in FIG. 13, one of the separate clock signals clk1-clk4 is routed to each circuit block 602. According to the embodiment of FIG. 13, for example, a selection circuit 1302 couples an enable signal to each of the circuit blocks 602. Each selection circuit 1302 may comprise a fuse which may be separately blown to decouple the enable signal to the circuit block if the circuit block is not used or is determined to be defective. While the clock circuits are provided for enabling data to be processed synchronously within a circuit block 602, it should be understood that the one or more clock signals could be generated internally within the circuit block. Further, according to some embodiments, the circuits implemented in the circuit blocks 602 may operate asynchronously.

In order to accommodate redundant circuit blocks, it is necessary to associate an address with each of the circuit blocks. Global routing to the various circuit blocks requires that an address be sent with each packet of data. According to the embodiment of FIG. 14, section addresses may be serialized with data, enabling the data to be provided to circuit blocks which are separately addressable. An address decoder 1402 of each circuit block 602 is coupled to receive input data and decode an address associated with the data. Only the circuit block 602 having the corresponding address of the decoded data will read the decoded data. While the various features of FIGS. 9-14 are shown in separate embodiments, it should be understood that various aspects of FIGS. 9-14 may be implemented together.

As will now be described in more detail, the circuits and methods of the various embodiments enable global asynchronous, local synchronous (GALS) data communication in an integrated circuit. Global communication is performed at the highest level of routing (i.e. using long lines), where data is provided as asynchronous and pipelined data. The routing to the circuit blocks may be asynchronously pipelined at the edges and the middle of each circuit block. The asynchronous routing to the circuit blocks will first be described in reference to FIGS. 15-23. The asynchronous routing by each circuit block to circuits inside a circuit block will then be described in more detail in reference to FIGS. 24-30.

Before describing specific circuits of a routing network for asynchronously routing data, an example of an architecture for routing data to a plurality of circuit blocks will be described. The block diagram of FIG. 15 shows an exemplary integrated circuit having an array of substantially similar circuit blocks interconnected by a pipelined interconnect structure. The interconnect structure in the illustrated embodiment includes an array of substantially similar programmable routing structures 1501, with each of the routing structures 1501 being coupled to an associated circuit block 602. In the present specification, the term "substantially similar" is understood to mean similar to the extent that each substantially similar element performs the same functions in the same way. For example, substantially similar circuit blocks include the same internal elements, e.g., lookup table and storage elements, have the same internal connections between these elements, and are programmed in the same fashion. Further, substantially similar programmable routing structures couple together interconnect lines having the same logical relationships, are programmed in the same fashion, and so forth. Substantially similar elements may have a single layout, stepped and repeated, but this is not always the case. The addition of relatively small amounts of extra logic (e.g., buffers, capacitors, etc.) to one or more circuit blocks and/or programmable routing structures do not prevent the circuit blocks, tiles, and/or programmable routing structures from being substantially similar, nor do changes in layout, transistor sizes, and so forth.

In the illustrated embodiment of FIG. 15, each circuit block 602 includes at least one programmable interconnect point 304. Examples of buffer circuits which may be implemented in the programmable interconnect points 304 to enable asynchronous communication to the circuit blocks 602 are described in reference to FIGS. 17-19. Typically, one buffer circuit 1502 is coupled to drive an output of the circuit block. Other buffer circuits may be included in the circuit block 602 as well, to provide additional pipelining functions. However, each circuit block may include more than one output driven by a buffer circuit. The output of each circuit block may be a single bit, or a multi-bit bus.

FIG. 15 illustrates an integrated circuit in which the outputs of each programmable routing structure 1501 are coupled to drive either an input of another routing structure, or an input of one of the circuit blocks. The output of each circuit block is coupled to drive an input of a corresponding programmable routing structure. In the pictured embodiment, each routing structure is coupled to vertical interconnect lines 1504, horizontal interconnect lines 1505, and diagonal interconnect lines 1506. However, in some embodiments some of these interconnect lines (e.g., diagonal interconnect lines 1506) are not provided. Note that interconnect lines 1504-1506 may be single lines or multi-bit busses. For example, in one embodiment each interconnect line 1504-1506 is an 8-bit bus, and also includes supporting signals. Interconnect lines 1507 also enable communication with circuit blocks 602.

Additionally, the interconnect lines in the embodiments described herein are all unidirectional. Unidirectional interconnect lines may permit a more efficient implementation of a pipelined programmable routing structure, because the overall number of routing multiplexers can be reduced relative to a bidirectional implementation. However, it should be understood that bi-directional signal lines could also be employed. The interconnect lines shown in FIG. 15 are all "singles." That is, they connect a routing structure to another routing structure in an adjacent tile, either vertically adjacent (by way of interconnect lines 1504), horizontally adjacent (by way of interconnect lines 1505), or diagonally adjacent (by way of interconnect lines 1506). As described above with respect to FIG. 3, interconnect lines in this type of integrated circuit architecture may include "doubles", which connect to a routing structure in a circuit block which is two circuit blocks away, "quads", which connect to a routing structure in a circuit block which is four circuit blocks away, and/or interconnect lines of other lengths. For clarity, interconnect lines other than singles are omitted from FIG. 15. However, some embodiments may include such interconnect lines.

Including buffer circuits which enable asynchronous communication in the interconnect structure enables the use of asynchronous routing. In some embodiments, both the interconnect structure and the circuit blocks are implemented asynchronously. Thus, the high level of design complexity caused by the problem of clock skew in a large integrated circuit is overcome. Additionally, the elimination of large global clock networks from the integrated circuit may substantially reduce the amount of power consumed by the integrated circuit when in operation. As will be described in more detail below, other embodiments may include a clocking network which couples one or more clock signals to the circuit blocks 602, where the data processed by the circuit blocks will be processed synchronously. Such an arrangement enables global asynchronous, local synchronous operation.

Figure 16:
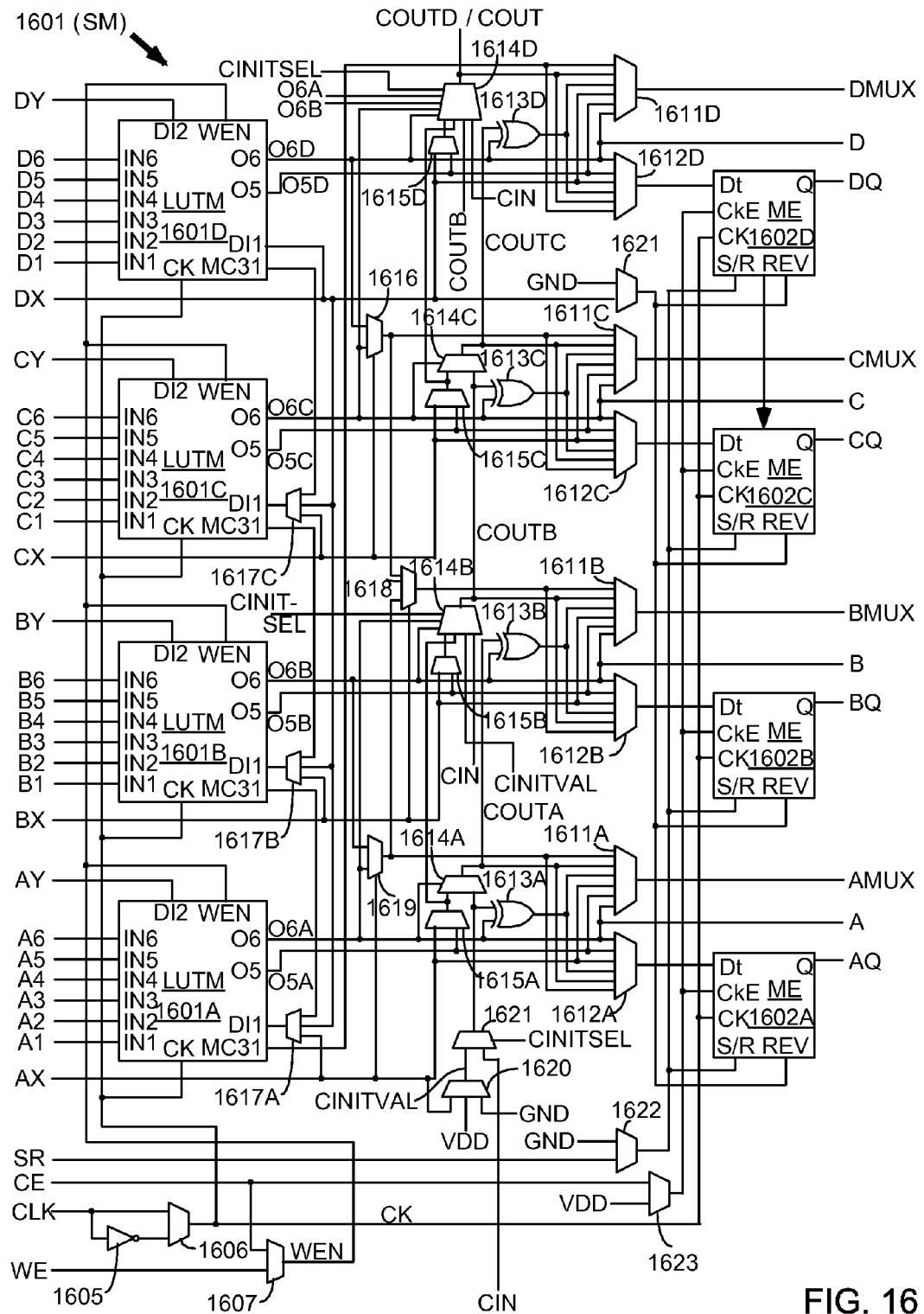
FIG. 16 is a block diagram of a configurable logic element which may be implemented in a circuit block according to an embodiment.

The circuit of FIG. 15 is provided to show an overall structure for enabling asynchronous data communication. Before describing the operation of asynchronous data communication to a circuit block 602, an example of a circuit block 602 will be described. In particular, a block diagram of a configurable logic element 1601 which may be implemented in a circuit block 602 according to an embodiment is shown in FIG. 16. In the embodiment of FIG. 16, slice M 1601 includes four lookup tables (LUTMs) 1601A-1601D, each driven by six LUT data input terminals A1-A6, B1-B6, C1-C6, and D1-D6 and each providing two LUT output signals O5 and O6. The O6 output terminals from LUTs 1601A-1601D drive slice output terminals A-D, respectively. The LUT data input signals are supplied by the interconnect structure via input multiplexers, which may be implemented by programmable interconnect points, and the LUT output signals are also supplied to the interconnect structure. Slice M also includes: output select multiplexers 1611A-1611D driving output terminals AMUX-DMUX; multiplexers 1612A-1612D driving the data input terminals of memory elements 1602A-1602D; combinational multiplexers 1616, 1618, and 1619; bounce multiplexer circuits 1622-1623; a circuit represented by inverter 1605 and multiplexer 1606 (which together provide an optional inversion on the input clock path); and carry logic having multiplexers 1614A-1614D, 1615A-1615D, 1620-1621 and exclusive OR gates 1613A-1613D. All of these elements are coupled together as shown in FIG. 16. Where select inputs are not shown for the multiplexers illustrated in FIG. 16, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 16 for clarity, as well as from other selected figures herein.

In the pictured embodiment, each memory element 1602A-1602D may be programmed to function as a flip-flop or latch. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1602A-1602D are clocked by a clock signal CK, which may be provided by a global clock network or by the interconnect structure, for example. Such programmable memory elements are well known in the art of FPGA design. Each memory element 1602A-1602D provides a registered output signal AQ-DQ to the interconnect structure. Because each LUT 1601A-1601D provides two output signals, O5 and O6, the LUT may be configured to function as two 5-input LUTs with five shared input signals (IN1-IN5), or as one 6-input LUT having input signals IN1-IN6.

In the embodiment of FIG. 16, each LUTM 1601A-1601D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1617A-1617C for LUTs 1601A-1601C), or to the two 32-bit RAMs via input terminals DI1 and DI2. RAM write operations in the LUT RAMs are controlled by clock signal CK from multiplexer 1606 and by write enable signal WEN from multiplexer 1607, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1601A may also be provided to the general interconnect structure for shift register chaining, via output select multiplexer 1611D and CLE output terminal DMUX.

Figure 17:
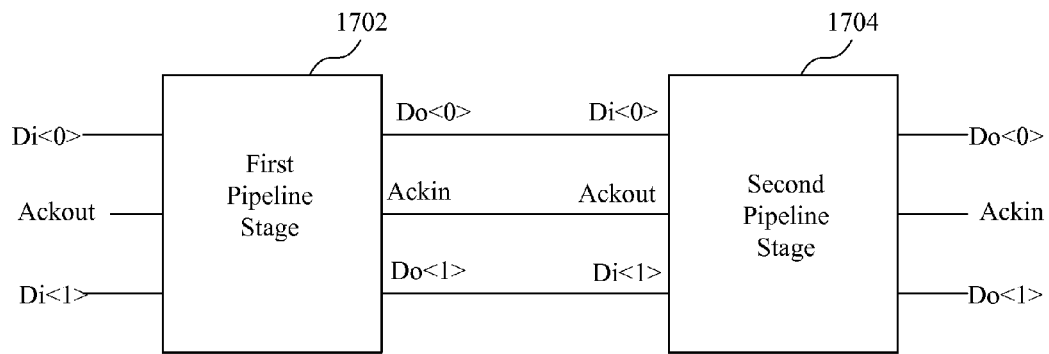
FIG. 17 is a block diagram showing signaling which enables asynchronous communication between a pair of circuits in a pipelined stage according to an embodiment.

Turning now to FIG. 17, a block diagram of a pair of circuits enabling asynchronous communication according to an embodiment is shown. While programmable logic devices have been beneficial in enabling designers to deliver high bandwidth, delivering bandwidth through longer wires will be more difficult as the size of programmable logic devices increases. Many emerging applications of large integrated circuits, such as high performance computing and packet processing, can tolerate a few cycles of clock latency. The circuits and methods of the various embodiments enable communication between circuit blocks by providing an inherently elastic source of data for destination circuit blocks having multiple frequencies. Accordingly, pipelining the data to increase the throughput according to embodiments will be beneficial in high performance computing and packet processing applications.

The circuit of FIG. 17 enables dual rail asynchronous data transfer, and shows the transfer of data between a first pipeline stage 1702 and a second pipeline stage 1704, where the second pipeline stage is "downstream" of the first pipeline stage. Each of the second pipeline stage and the first pipeline stage are substantially similar, but are shown together for showing how the circuits implement asynchronous communication. That is, because each stage both receives inputs from an upstream circuit and generates outputs to a downstream circuit, it is necessary to show the two circuits together. However, a description of the operation of only one circuit is necessary. The operation of the first pipeline stage as designated in FIG. 17 is shown by way of example. However, it should be understood that the first pipeline stage also operates as a downstream pipeline stage and second pipeline stage operates as an upstream pipeline stage. That is, the first pipeline stage 1702 is also a consumer of data from an "upstream" producer, and the second pipeline stage 1704 is also a producer to a further downstream consumer. Accordingly, a description of the operation of the first pipeline stage 1702 will also fully describe the operation of the second pipeline stage 1704.

The circuits of the first pipeline stage 1702 and the second pipeline stage 1704 may comprise an optimized weak conditioned half buffer (WCHB) which operates as a dual-rail buffer. Di<0> and Di<1>, and Do<0> and Do<1> identify the false and true dual rail inputs and outputs, respectively. An input acknowledge (Ackin) of a pipeline stage providing data is generated in response to receiving a corresponding output acknowledge (Ackout) from a pipeline stage receiving data. For example, when the first pipeline stage 1702 receives Di<0>, and Di<1> signals, it will generate an Ackout signal. Further, when the second pipeline stage 1704 receives the Do<0< and Do<1> signal (as corresponding inputs Di<0> and Di<1>), the second pipeline stage 1704 will generate an Ackout signal. The Ackout signal from the second pipeline stage 1704 (which is received as a corresponding Ackin signal at the first pipeline stage 1702) will then enable the first pipeline stage 1702 to provide the data received at its inputs (and which it had previously acknowledged with an Ackout signal) as the Do<0> and Do<1> signals. It should be noted that through the specification, an output signal from one circuit is also designated as an input circuit to another circuit. For example, a data output of one circuit is also a data input of another circuit, or an acknowledge input of one circuit is also an acknowledge output of another circuit. Such a designation of signals simplifies the description of a given circuit, as well as the operation of two circuits together. Accordingly, the use of names for a signal with respect to a given circuit clarifies the function of the signal and operation of the overall circuit.

The programmable interconnect points may include multiplexers, buffers, and memory cells, and enable asynchronous data communication, such as the asynchronous data communication described in reference to FIG. 17. According to one embodiment, a weak condition half buffer (WCHB) is employed in output buffers of the programmable interconnect points to further enable pipelining. While there are no changes to the multiplexer circuit 502 of FIG. 5, the output buffers 503 may be implemented as a weak condition half buffer according to the embodiments of FIGS. 18 and 19.

Figure 18:
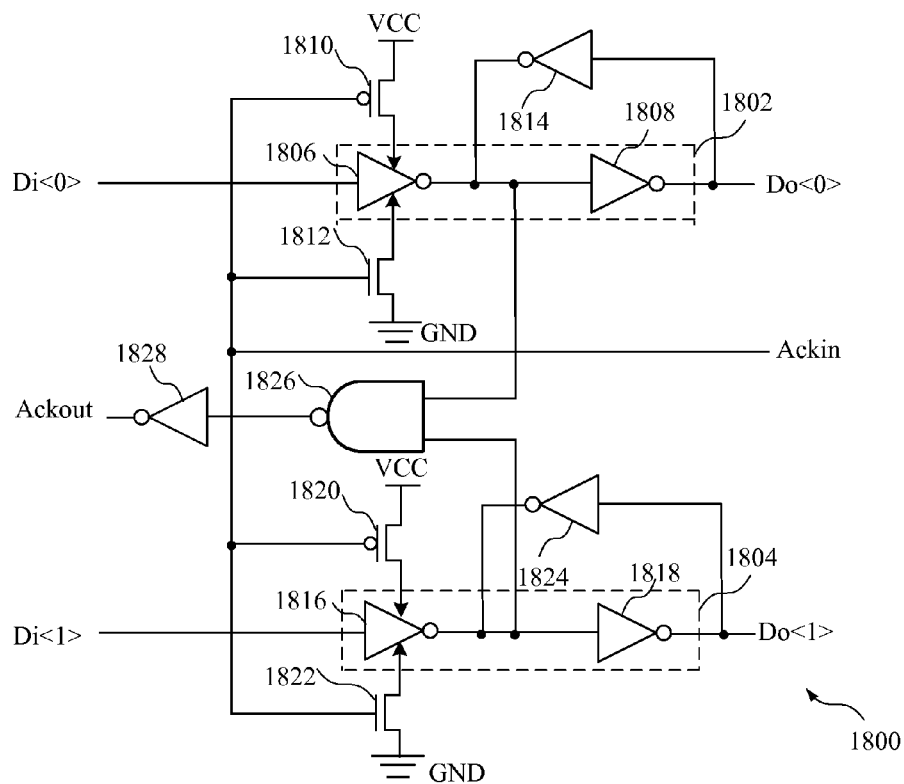
FIG. 18 is a block diagram of a buffer circuit implemented in each of the circuits of FIG. 17 to enable asynchronous communication according to an embodiment.

As shown in FIG. 18, a buffer circuit 1800 receives input data Di<0> and Di<1> at output buffers 1802 and 1804, respectively. The output buffers 1802 and 1804 generate the data output signals Do<0> and Do<1>, respectively. The output buffer 1802 includes a first inverter 1806 and a second inverter 1808 coupled in series. Inverter 1806 is biased by a first transistor 1810 which is coupled between a reference voltage VCC and a first bias input of the inverter. The transistor 1810 receives an Ackin signal at its gate. The inverter 1806 is also biased by a transistor 1812 which is coupled between a ground (GND) potential and a second bias input of the inverter. The transistor 1812 also receives the Ackin signal at its gate. A feedback inverter 1814 coupled between the output of inverter 1808 and the input of inverter 1808 enables latching data at the output of inverter 1808.

The output buffer 1804 also includes a pair of inverters including inverters 1816 and 1818. Inverter 1816 is biased by a first transistor 1820 which is coupled between VCC and a bias input of the inverter, and which receives the Ackin signal at its gate. The inverter 1816 also biased by a transistor 1822 which is coupled between a ground potential and a bias input of the inverter, and which also receives the Ackin signal at its gate. A feedback inverter 1824 coupled between the output of inverter 1818 and the input of inverter 1818 enables latching data at the output of inverter 1818. The node between the output of the inverter 1806 and an input of the inverter 1808 is coupled to a first input of a NAND gate 1826, while the node between the output of the inverter 1816 and an input of the inverter 1818 is coupled to a second input of a NAND gate 1826. The output of the NAND gate is coupled to an inverter 1828, which generates the Ackout signal.

The circuit of FIG. 18 could be implemented in the programmable interconnect point of FIG. 5 to provide output buffer 503 of FIG. 5, for example, to implement an asynchronous routing network. Because dual rail data is implemented in the programmable interconnect points, output buffers 1802 and 1804 are provided. The generation of dual rail data in the integrated circuit will be described in more detail in reference to the transmitter circuit 2100 of FIG. 21. By providing weak conditioned half buffers associated with the programmable interconnect points, asynchronous communication may be provided by the circuits implementing the buffer circuit 1800 of FIG. 18. While additional transistors are required by the inverters 1814 and 1824 and the NAND gate 1826, the circuit of FIG. 18 enables implementing asynchronous data communication in programmable interconnect points having a minimal area and latency penalty, where the sizing of the transistors may be selected based upon a trade-off between speed and area.

Figure 19:
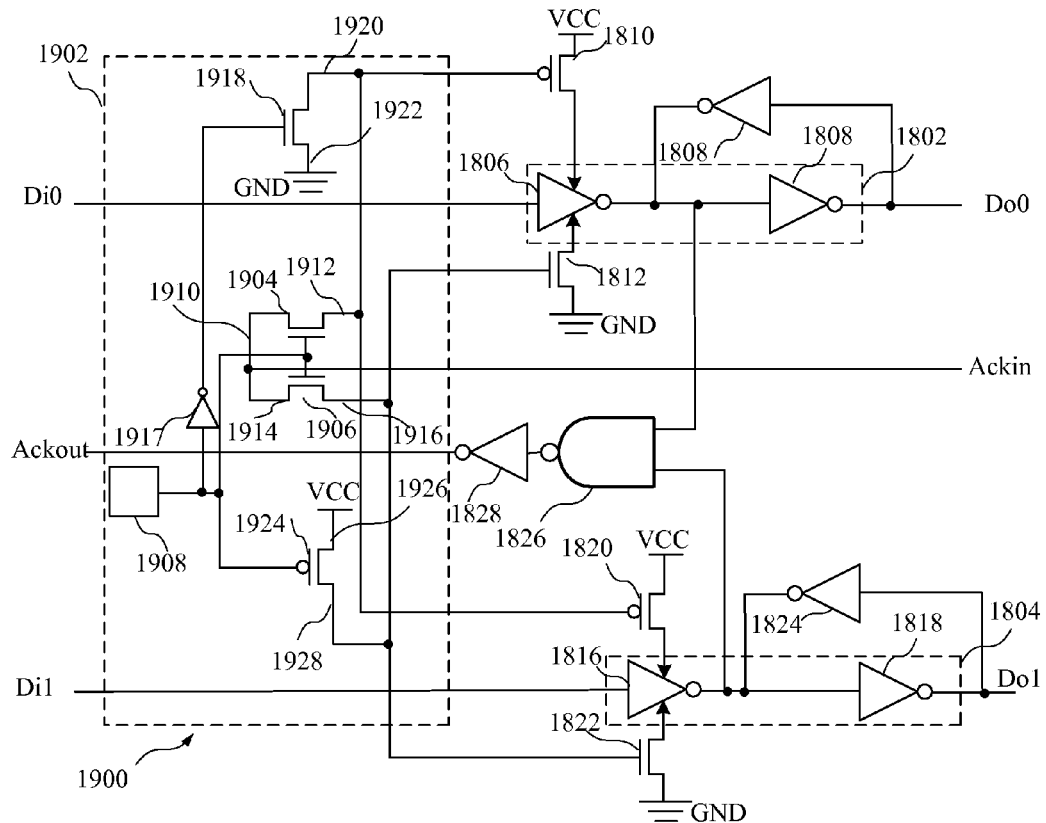
FIG. 19 is a block diagram of a buffer circuit implemented in each of the circuits of FIG. 17 to enable asynchronous communication according to an alternate embodiment.

According to the embodiment of FIG. 19, the circuit 1800 of FIG. 18 may be modified to function as a conventional programmable interconnect point. That is, the circuit 1900 of FIG. 19 may be programmed to function according to the embodiment of FIG. 18 to enable asynchronous communication, or may be programmed to disable the circuit elements which enable the weak condition half buffer and pass the input signals to the output buffers 1802 and 1804 as outputs.

Because there may be some instances when the data is transmitted synchronously, it is not necessary to operate the programmable interconnect points as weak condition half buffer circuit. For example, programmable interconnect points that are implemented for routing data within a circuit block 602 which processes data synchronously do not require a weak condition half buffer. Accordingly, the circuit elements which enable the circuit of FIG. 18 to be implemented as a weak condition half buffer may be disabled.

More particularly, a programmable circuit 1902 shown in FIG. 9 includes a pair of transistors 1904 and 1906 which are each coupled at their gates to a programmable element 1908. The programmable element 1908 may store a configuration bit downloaded to the integrated circuit by way of a configuration bitstream. The configuration bits for programming the buffer of FIG. 19 are stored in configuration memory which may also store the configuration bits which are used to configure other programmable resources of the integrated circuit, such as the CLE described in FIG. 16. The transistor 1904 is coupled between the Ackin signal at a terminal 1910 of transistor 1904 and the gates of the p-channel transistors 1810 and 1820 at a terminal 1912 of transistor 1904. The transistor 1906 is coupled between the Ackin signal at a terminal 1914 of transistor 1904 and the n-channel transistors 1812 and 1822 at a terminal 1916 of the transistor 1906. The programmable element 1908 is also coupled to an inverter 1917, the output of which is coupled the gate of a transistor 1918. A terminal 1920 of the transistor 1918 is coupled to the gate of the transistor 1810, and a terminal 1922 of the transistor 1918 is coupled to ground. The gate of a transistor 1924 is coupled to the programmable element 1908. A terminal 1926 of transistor 1924 is coupled to VCC, while a terminal 1928 is coupled to the gate of the transistor 1822.

In operation, when the programmable element 1908 is set at a low input, such as a logical "0", transistors 1904 and 1906 are all turned off, decoupling the Ackin signal from the gates of the transistors which provide control signals to the output buffers 1802 and 1804. The programmable memory element set at a low input also turns on transistor 1918 by way of inverter 1917, coupling a low voltage to the gate of transistors 1810 and 1820. The low value of the programmable element 1908 also turns on transistor 1924 to pull the gates of the transistors 1812 and 1822 high to turn on transistors 1812 and 1822. In contrast, when the programmable element 1908 is set at high input, such as a logical "1", transistors 1918 and 1924 are turned off, and transistors 1904 and 1906 are turned on, driving the Ackin signal to the gates of transistors 1810 and 1820. Accordingly, the buffer circuit 1900 of FIG. 19 may operate in two modes depending upon the data stored in programmable element 1908. In a first mode, the buffer circuit may operate to pass the Di<0> and Di<1> data, while in a second mode the buffer circuit may operate to pass the data asynchronously in response to an Ackin signal.

While the circuits of FIGS. 18 and 19 require additional transistors to enable asynchronous communication and may therefore be larger than conventional interconnect buffers, the circuits of FIGS. 18 and 19 increase the throughput in the circuit. The circuits of FIGS. 18 and 19 using transistors having 65 nm gate widths implemented at the slowest performance pressure, voltage and temperature (PVT) enable an approximately 525 MHz throughput for a transmission line distance of approximately 1.5 mm. Further, there is no throughput penalty as a result of pipelining after the first 2 stages. Interconnect area penalty for an integrated circuit with transistors having 65 nm gates can be estimated to 10% per interconnect. If we assume that the programmable interconnect points of FIGS. 18-19 are only implemented in the highest level of interconnect (i.e. the longest interconnect lines), an overall interconnect area penalty of 1-3% can be estimated for the entire integrated circuit, or 2-6% when transmitting dual rail data. Accordingly, while the programmable interconnect points may have a slightly larger area, they also increase throughput and may therefore reduce the circuit requirements for implementing a circuit.

Figure 20:
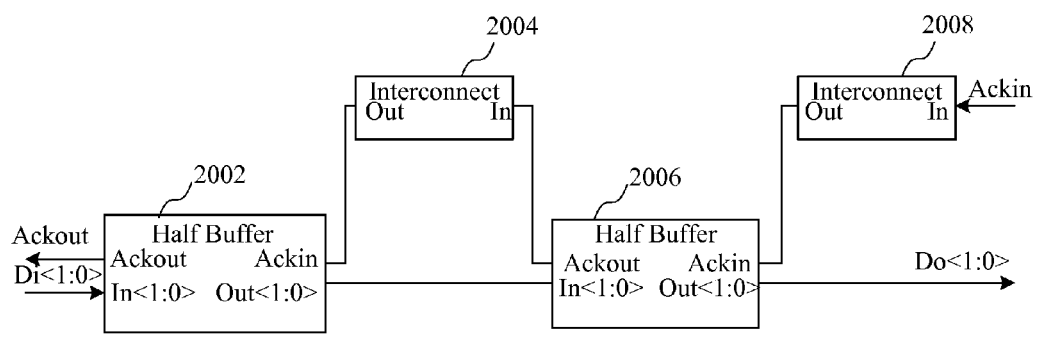
FIG. 20 is a block diagram of a full buffer according to an embodiment.

Turning now to FIG. 20, a block diagram of a full buffer is shown. Because a full buffer is necessary to transmit the dual rail data, two half buffer circuits, such as the buffer circuits described in FIGS. 18 and 19, may be coupled together to make a full buffer. A first half buffer 2002 is coupled to receive an input Di<1:0> which is coupled to an output based upon the receipt of an acknowledge signal from a programmable interconnect 2004 as described above with respect to FIGS. 17 and 18. The output of the first half buffer 2002 is provided to an input of a second half buffer 2006, which also receives an acknowledge output of a corresponding programmable interconnect 2008. According to the embodiment of FIG. 20, the conventional buffers may be implemented to transmit the acknowledge signals, while the buffers of FIG. 18 may be implemented as half buffers 2002 and 2006. Alternatively, the interconnects 2004 and 2008 may be the buffers of FIG. 19 implemented to bypass the acknowledge functionality, and therefore transmit an acknowledge signal as data. According to a further embodiment, each of the circuits of FIG. 20 may be implemented using the programmable buffer circuit of FIG. 19, where the half buffers 2002 and 2004 are configured to function as half buffers, and the interconnects 2006 and 2008 are configured to bypass the half buffer functionality and transmit acknowledge signals as data.

Figure 21:
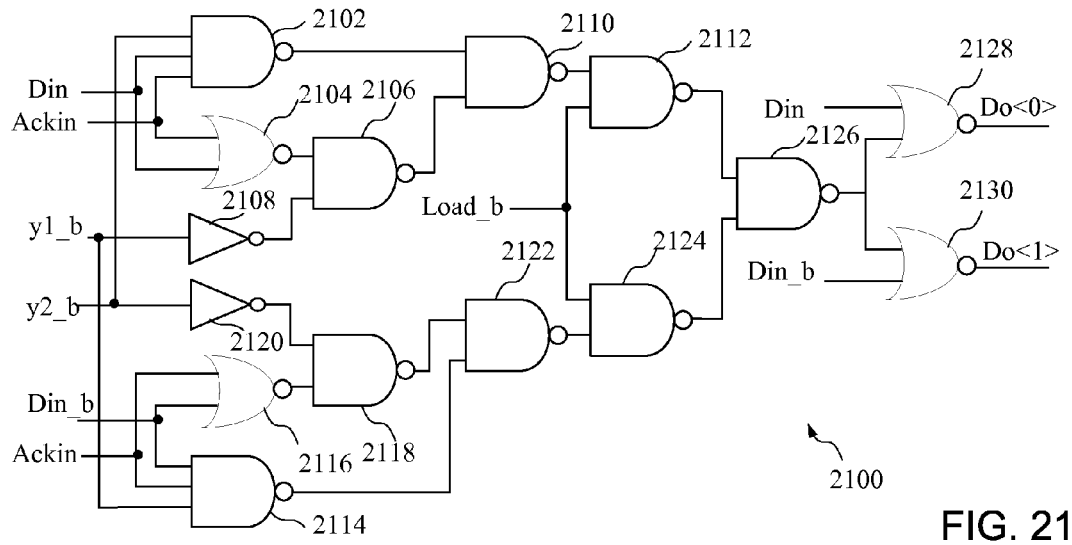
FIG. 21 is block diagram of a transmission endpoint circuit according to an embodiment.

Turning now to FIG. 21, a block diagram of a transmission endpoint circuit 2100 is shown. The transmission endpoint circuit 2100 enables the changing of data from single ended data to dual rail data. The transmission endpoint may be used at any location in the integrated circuit where it is necessary to convert from single ended data to dual rail data. As will be described in more detail in reference to FIG. 29, the transmission endpoint may be used in a routing circuit of the circuit block to generate data to be transmitted on a transmission line between two circuit blocks. The input data Din comprises single ended data which is coupled to a NAND gate 2102 and an input of a NOR gate 2104. The output of the NOR gate 2104 is also coupled to a first input of a NAND gate 2106, which is also coupled to receive the output of an inverter 2108. The inverter 2108 receives a signal y1_b at its input. The output of the NAND gate 2106 is coupled to a first input of a NAND gate 2110, which also receives an output of the NAND gate 2102. The output of the NAND gate 2110 is coupled to a first input of a NAND gate 2112, which is also coupled to receive an inverted load signal (Load_b).

Inverted input data Din_b and Ackin signal are each coupled to a NAND gate 2114 and a NOR gate 2116. The output of the NOR gate 2116 is also coupled to a first input of a NAND gate 2118, which is also coupled to receive the output of an inverter 2120. The inverter 2120 receives a signal y2_b at its input. The output of the NAND gate 2118 is coupled to a first input of a NAND gate 2122, which also receives an output of the NAND gate 2114. A NAND gate 2124 is coupled to receive the output of the NAND gate 2122 and the Load_b signal. A NAND gate 2126 is coupled to receive the outputs of the NAND gates 2112 and 2124, and provide an output to each of two NOR gates 2128 and 2130. NOR gate 2128 also receives the data input Din to generate a first output Do<0> of the dual rail data, while NOR gate 2130 also receives the inverted data Din_b to generate the second output Do<0> of the dual rail output.

Figure 22:
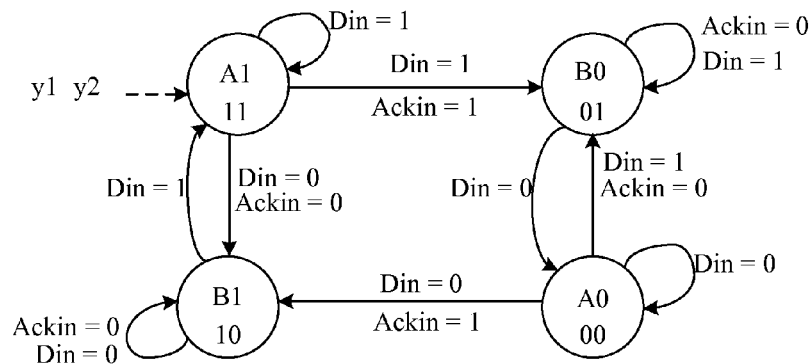
FIG. 22 is state diagram associated with the transmission endpoint circuit of FIG. 21.

The operation of the circuit is described in reference to the state diagram of FIG. 22 having state values y1 and y2. In a first state A1, the values of y1, y2 are 11. The state of the circuit remains in state A1 while Din=1, and until Ackin=1, or Din=0 and Ackin=0. When Din=1 and Ackin=1, the circuit moves to a state B0 having y1, y2 values of 01. The state of the circuit will remain in state B0 as long as Ackin=0 and Din=1. When Din=0, the state of the circuit will transition to a state A0 having y1, y2 values of 00, and will remain in that state as long as Din=0. The state of the circuit will return to state B0 when Din=1 and Ackin=0.

The state of the circuit could also move to a state B1 having y1, y2 values of 10 from either state A1 or A0. That is, the state of the circuit could move from state A1 to state B1 when Din=0 and Ackin=0. The state of the circuit will remain in state B1 as long as Ackin=0 and Din=0, and will return to state A1 when Din=1. When in the state A0, the state of the circuit could transition to state B1 when Din=0 and Ackin=1. Accordingly, the transmission endpoint circuit 2100 of FIG. 21 enables the conversion of data from single ended data to dual rail data in response to the single ended input data Din, an acknowledge signal (Ackin) and the inverted load signal (Load_b). Further, the transmission endpoint circuit asynchronously generates the dual rail data when used in conjunction with other elements of a transmission path, such as a full buffer, as will be described in more detail below in reference to FIG. 24.

Figure 23:
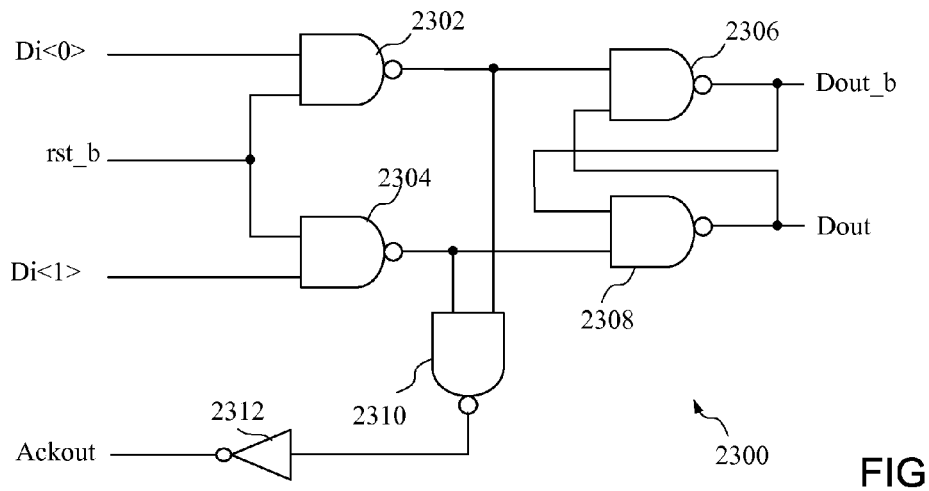
FIG. 23 is a block diagram of a receiver endpoint circuit according to an embodiment.

However, turning first to FIG. 23, a block diagram of a receiver endpoint circuit 2300 is described. Because the receiver endpoint of FIG. 23 is responsive only to a single state (i.e. an inverted reset signal (rst_b)), no state machine is necessary for the implementation of the receiver endpoint circuit of FIG. 23. The receiver endpoint circuit 2300 converts the dual rail data to single rail data. A first NAND gate 2302 receives input data Di<0>, while a second NAND gate 2304 receives a second input Di<1>. Each of the NAND gates 2302 and 2304 receives the inverted reset signal rst_b at a second input. The outputs of each of the NAND gates 2302 and 2304 are coupled to an input of NAND gates 2306 and 2308, respectively. The outputs of the NAND gates 2306 and 2308 comprise the inverted single ended output Dout_b and single ended output Dout, respectively. The outputs of the NAND gates 2306 and 2308 are fed back to second inputs of the other NAND gates as shown. Finally, the output of the NAND gates 2302 and 2304 are coupled to a NAND gate 2310, the output of which is coupled to an inverter 2312 that generates an Ackout signal.

Figure 24:
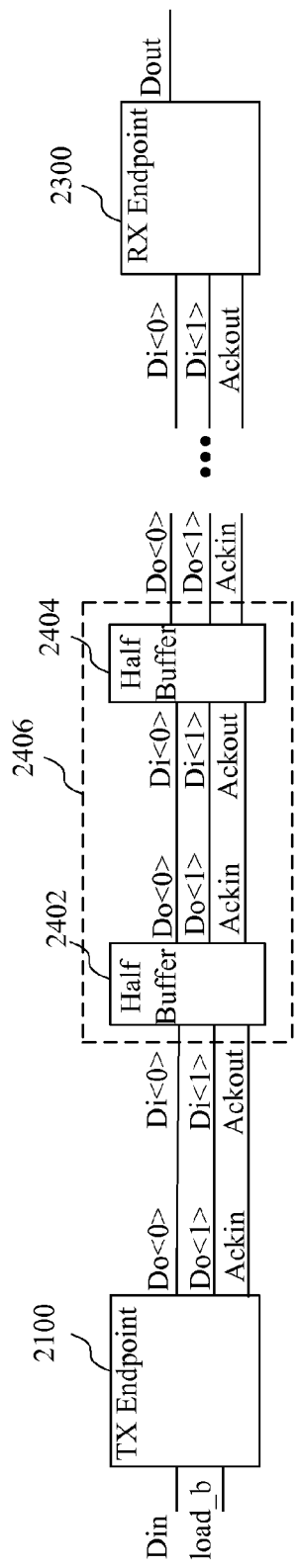
FIG. 24 is a block diagram of a buffered transmission path according to an embodiment.
Figure 25:
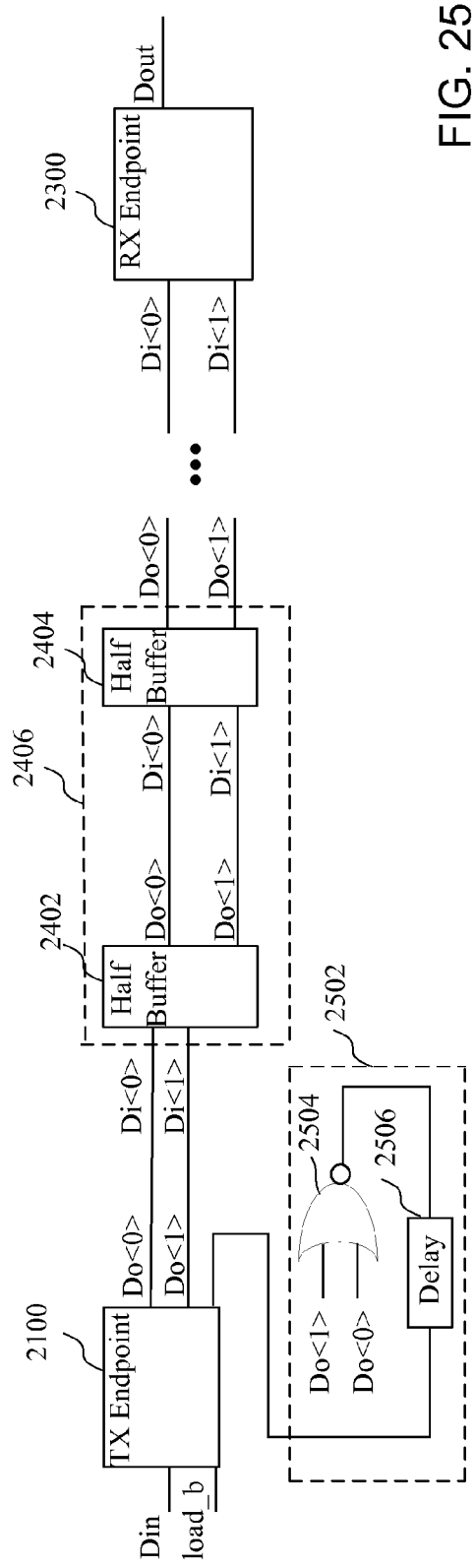
FIG. 25 is a block diagram of a buffered transmission path according to an alternate embodiment.

As shown in FIGS. 24 and 25, a buffered transmission line may be implemented using an arrangement of half buffers 2402 and 2404 coupled to form a full buffer 2406, between a receiver endpoint 3200 and a transmission endpoint 2100. Any number of full buffers may be implemented in the buffered transmission line, depending upon the number of pipelined stages that are required. The full buffers may be implemented as described above with respect to FIG. 20. Each element of the circuits of FIGS. 24 and 25 enables the asynchronous transmission of data in the buffered transmission line.

However, according to the embodiment of FIG. 25, a buffered transmission path enabling wave pipelining is provided. Wave pipelining is a pipelining technique which enables multiple waves of data to propagate through a wave pipeline without internal latching. Wave pipelining may be implemented where there are known path delays. Rather than generating acknowledge signal between the various elements of the transmission path, a circuit 2502 enables internally generating an acknowledge signal to the transmission endpoint 2100. That is, an acknowledge signal can be generated locally within the circuit block or other element having a transmission endpoint to enable wave pipelining. In particular, the outputs of the transmission endpoint 2100 are coupled to a NOR gate 2504. The output of the NOR gate is coupled to a delay element 2506, the output of which is coupled to an acknowledge input of the transmission endpoint. By employing the circuit 2502, it is possible to increase the throughput of the transmission path at the expense of elasticity. Elasticity refers to the tolerance to changes in timing, where a more elastic circuit is more tolerant to variations in timing in a circuit path. Implementing acknowledge signals provides a highly elastic data path. However, it takes time for an acknowledge signal to arrive at an input of a source, and the cost of the increased elasticity provided by the acknowledge signal is throughput.

Because the traveling time of acknowledge signal is a primary reason for an upper bound on throughput, it is possible to implement wave pipelining to reduce that upper bound based upon two assumptions. The first assumption is that identical buffers and wires in the vicinity of each other on the same chip have roughly the same latency. The second assumption is that interconnect buffers may act as temporary latches, implying that a minimum allowed time between data tokens is maximum delay between buffers. The second assumption can be classified as asynchronous wave pipelining. Simulation results indicate that using wave pipelining according to the embodiment of FIG. 25, a throughput of 770 MHz is achieved in the slowest performance pressure, voltage, and temperature (PVT) values, at the expense of elasticity. In order to implement the circuit of FIG. 25, the transmission and receiving circuit blocks coupled to the transmission path need to run of the same frequency, as is in conventional synchronous circuits. If the circuits are operating at different frequencies, quasi delay insensitive (QDI) asynchronous communication may be implemented for communication between two different frequencies.

Figure 26:
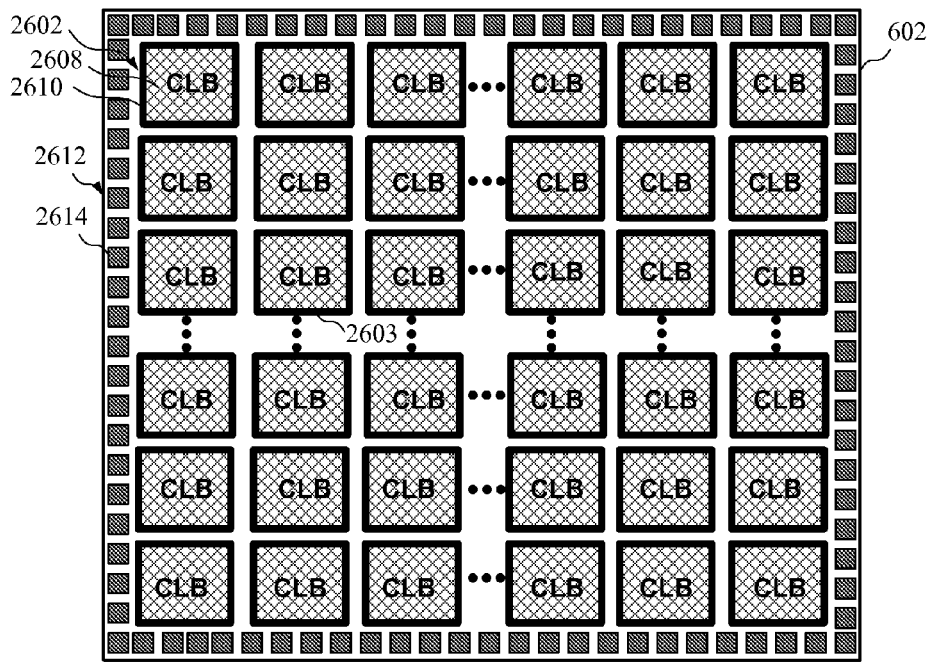
FIG. 26 is a block diagram of circuit block 602 according to an embodiment.

Having described the circuits for enabling the asynchronous communication of data between circuit blocks 602, circuits for enabling the coupling of data to and from internal circuits of the circuit block 602 will now be described. As shown in FIG. 26, each circuit block 602 is generally circled by routing circuits. The routing circuits may be controlled to operate as asynchronous shift registers which can serialize parallel data and send it over local routing interconnects dedicated to the circuit block. That is, the routing circuits enables the transfer of data from the inter-circuit block programmable interconnects described above with respect to FIGS. 3-24 to intra-circuit block interconnects which transfer data within a circuit block. The intra-circuit block interconnects may be implemented as programmable interconnect points described in reference to FIG. 3, but with shorter wires connecting the programmable interconnect points. Each circuit block may include programmable circuits with local clocking, a Block RAM, or other blocks such as a processor block, such as those implemented in programmable logic devices. The processor block may be a hard block such as PowerPC processor, or a processor implemented in programmable resources, such as the MicroBlaze processor available from Xilinx, Inc. of San Jose, Calif. While a circuit block 602 is shown according to the embodiment of FIG. 6 where all of the configurable blocks are CLBs, the routing circuits described in FIGS. 26-33 may be implemented with any type of configurable blocks, such as a BRAM or processing circuit. The routing circuits are preferably powered using the highest voltage on the chip and is not power gated.

The circuit block 602 includes a plurality of configurable blocks 2602. The configurable blocks comprise programmable resources for implementing a circuit design. The configurable blocks may be substantially similar in function, or may have different functions. According to the embodiment of FIG. 26, all of the configurable blocks 2602 are CLBs 2603. Such a circuit block would be implemented according to the embodiment of FIG. 7, where other functionality, such as memory or processing functionality would be implemented in one or more separate circuit blocks. However, when implemented according to the embodiment of FIG. 6, each circuit block 602 may comprise configurable blocks having other functionality than a CLB. For example, the circuit block 602 may comprise configurable blocks having memory or processing functionality, such as a processor or DSP block. As will be described in more detail below, each configurable block includes a programmable portion 2608 and a local interconnect portion 2610. The local interconnect portion 2610 may include programmable interconnects having programmable interconnect points as described above in reference to FIGS. 3 and 5. The configurable portion of CLB 2603 may comprise a CLE as described above in reference to FIG. 16. Each circuit block 602 also includes an interface portion 2612 having routing circuits 2614. The interface portion 2612 provides isolation for each circuit block. The routing circuits 2614 will be described in more detail in reference to FIGS. 28-33

The distribution of the various types of configurable blocks may be selected by a designer of the integrated circuit based upon anticipated needs of users for the various functions. While a CLE, a BRAM, and a processor blocks are described by way of example, it should be understood that other functional blocks could be implemented as configurable blocks 2602. Examples of other functional blocks include DSP blocks, digital clock management (DCM) blocks, or other configuration and control blocks. Computations are performed by configurable blocks synchronously and locally using a clock coupled to the circuit block and intra-circuit block interconnects or generated internally by the circuit block. As will be described in more detail below, the repeatable routing circuits 2614 enable time-multiplexed routing and asynchronous data communication with the configurable blocks 2602.

Each routing circuit 2614 of a plurality of routing circuits associated with a circuit block may be controlled to "load" or "unload" data and "shift" data. Routing circuits configured for loading data will be configured as "merge" circuits, while circuits configured for unloading data will be configured as "split" circuits. A merge circuit generally functions as a multiplexer for selecting one of a two inputs as an output. According to some embodiments, a merge circuit either selects data which is being loaded into a plurality of routing circuits or selects data being received from another routing circuit. Accordingly, data from N synchronous data lines may be loaded into a plurality of N routing circuits 2702 of a source circuit block 602A, and then serially shifted on the routing circuits and output on the $N^{th}$ routing circuit to a pipelined transmission line 2704. The pipelined transmission line 2704 comprises a fast media, such as programmable interconnects using long lines. Accordingly, the $N^{th}$ routing circuit 2614N of the plurality 2702 of routing circuits is configured as an endpoint routing circuit as will be described in more detail below.

A first routing circuit 2614A of a plurality of N routing circuits 2706 of a destination circuit block 602B is also configured as an endpoint routing circuit. But in this case, the first routing circuit 2614A is configured to receive the serial data by way of the pipelined transmission line 2704. The data received from the pipelined transmission line 2704 at the routing circuit 2614A is then shifted through a plurality of N routing circuits 2706 of the destination circuit block 602B. The data is then unloaded to the configurable blocks 2602 of the circuit block 602B by way of N synchronous data lines. That is, the plurality of N routing circuits 2706 are configured as split circuits. More particularly, they are configured to function as a demultiplexer for routing data received at a routing circuit to either another routing circuit or internal circuits such as a configurable block 2602 of the circuit block.

Figure 27:
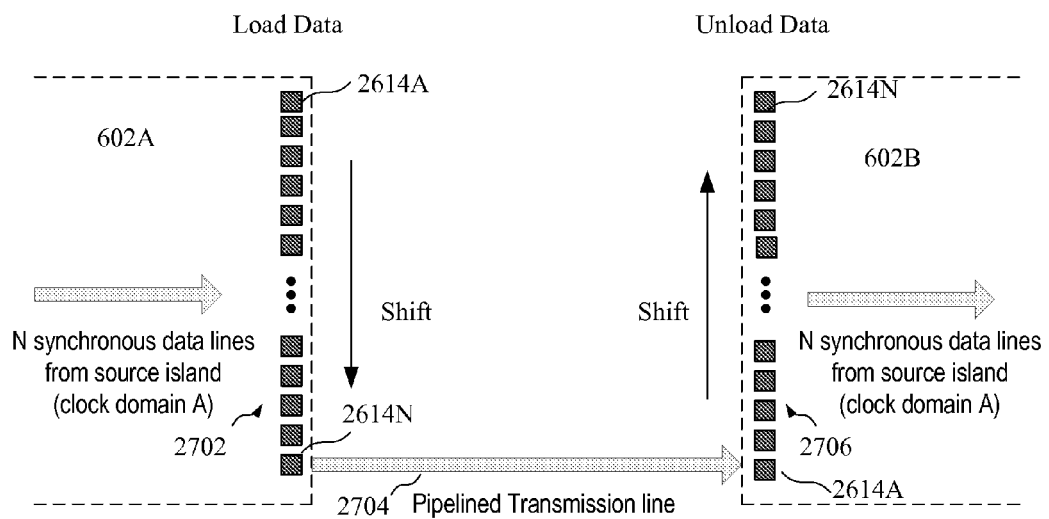
FIG. 27 is a block diagram showing the asynchronous communication of data between circuit blocks according to an embodiment.

The operation of the routing circuits 2614 will now be described. As shown in FIG. 27, N synchronous data lines from the source circuit block 602A, which may operate on a clock domain A, for example, is coupled to the plurality of routing circuits 2702. The plurality of routing circuits 2702 enable the loading of data, as well as the shifting of the data from the circuit block 602A to the pipelined transmission line 2704 by controlling the routing circuits to act as shift registers. The pipelined transmission line 2704 between the plurality of routing circuits of the source and destination circuit blocks 602A and 602B may be implemented according to the circuits described above in the description of FIGS. 24 and 25, where the transmission endpoint circuit 2100 may be a part of the source circuit block 602A and the receiver transmission endpoint may be a part of the destination circuit block 602B. The plurality of routing circuits 2706 of the destination circuit block 602B enables the shifting followed by unloading of data to internal circuits of the destination circuit block 602B. The destination circuit blocks 602B may be operating on the same clock domain A, or a different clock domain B.

One of the main reasons for the large area requirements of programmable logic devices is the vast amount of interconnects required for programmability. Programmable logic devices have always been larger than ASICs and application specific standard products (ASSP) due to the circuits required to programming. As transistors continue to get smaller, the interconnects may be time-shared with low overhead. The methods and circuits of some embodiments enable clockless time multiplexing of data. The speed and amount of time sharing is determined by the number of routing circuits in the plurality of routing circuits 2702 and 2706.

Figure 28:
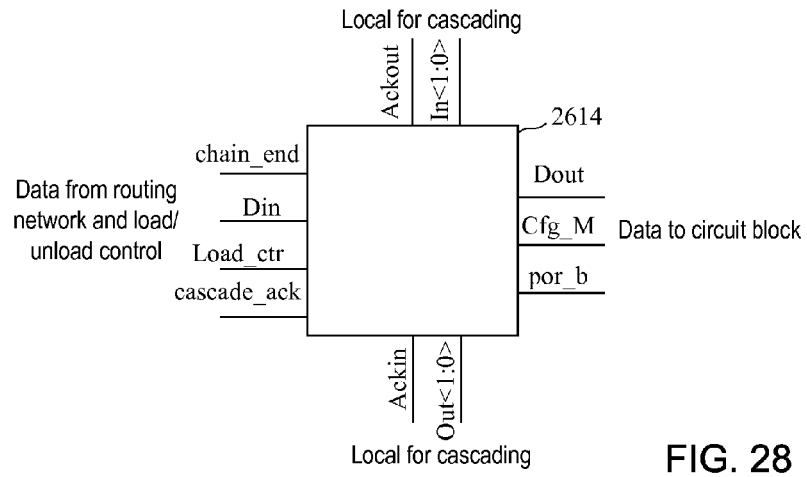
FIG. 28 is a diagram showing the input and output signals of the routing circuit 2614 according to an embodiment.

Turning now to FIG. 28, a block diagram shows the signaling associated with the routing circuit 2614 of FIG. 26. Each routing circuit 2614 may function to load data from internal circuits, such as a CLB of the circuit block, receive data from an adjacent routing circuit, transfer data to an adjacent routing circuit, and output data from the plurality of routing circuits to a transmission line. Each routing circuit configured as a split circuit may function to receive data from the transmission line, receive data from an adjacent routing circuit, transfer data to an adjacent routing circuit, and unload data to internal circuits of a circuit block. Input data associated with a given plurality of routing circuits could be received from internal circuits of a circuit block 602 transmitting data or from the pipelined transmission line 2704 when receiving data. As will be described in more detail below in reference to FIG. 29, input data (Din) is received and output data (Dout) is generated in response to a load control (Load_ctr) signal. That is, the Load_ctr signal is used for controlling when a merge circuit will load data in parallel and then shift data serially to a transmission line, or when a split circuit will shift data serially and then unload data in parallel.

Data which has already been received by a routing circuit is shifted within a plurality of routing circuits functioning as a shift register in response to a cascade acknowledge (Cascade_ack) signal. Input data which is already received by a routing circuit and shifted to another routing circuit is designated as input data In<1:0>. An acknowledge output (Ackout) may also be exchanged with an adjacent routing circuit above the routing circuit of FIG. 28 as shown. Similarly, output data (Out<1:0>) and an acknowledge input signal (Ackin) may be exchanged with another adjacent routing circuit below the routing circuit of FIG. 28 as shown. Accordingly, the routing circuits 2614 not only enable asynchronous communication with transmission lines which route signals between the circuit blocks, but also provide pipelining which enable clockless time multiplexing of the data.

Data is coupled from or to a routing circuit 2614 by way a transmission endpoint circuit 2100 and a receiver endpoint circuit 2300 described above in reference to FIGS. 21-23. As will be described in more detail in reference to FIGS. 29 and 32, a Chain_end signal and a Cascade_ack signal enable the shifting of data by groups of routing circuits. A merge configuration signal (Cfg_M) signal controls the routing circuit to either load or unload data, and an inverted power-on, reset (por_b) functions as an enable signal as will be set forth in more detail below. The por signal comprises an enable signals for enabling the various elements at power-on or reset.

Figure 29:
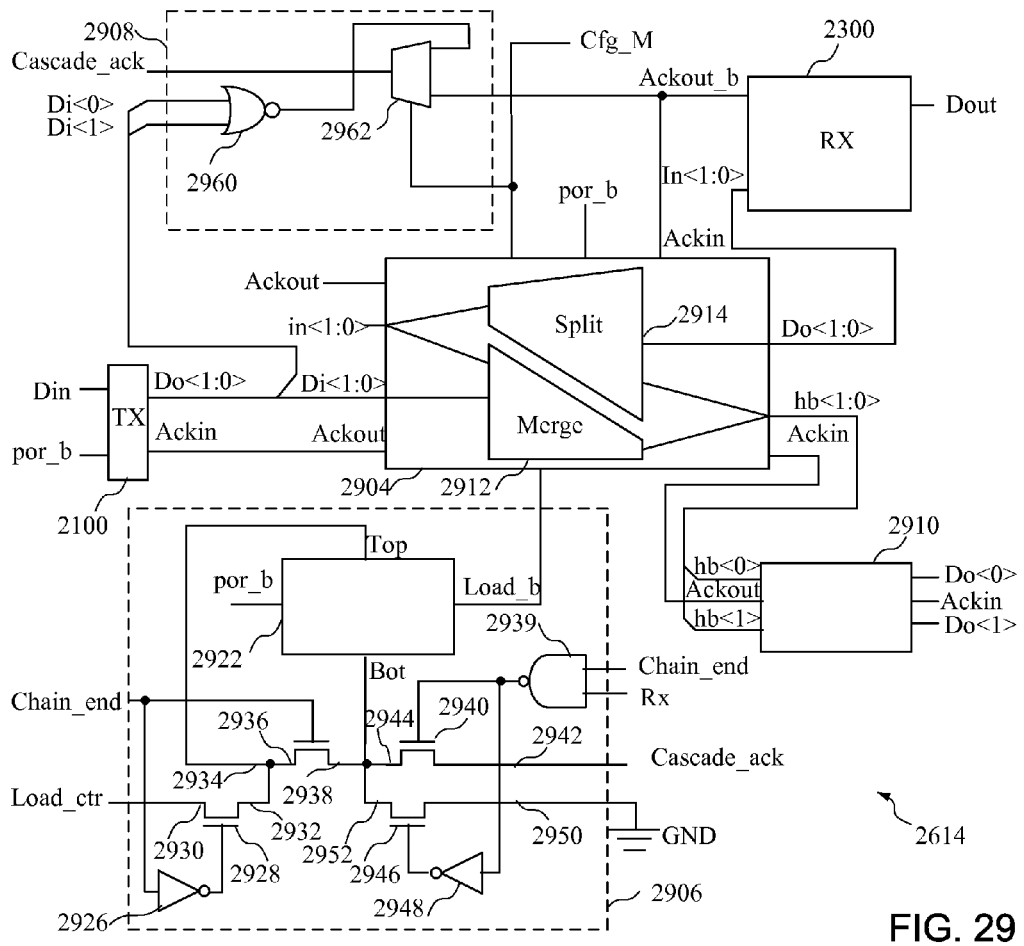
FIG. 29 is a block diagram of the routing circuit 2614 of FIG. 27 according to an embodiment.

Turning now to FIG. 29, a block diagram of the routing circuit 2614 is shown. Before describing the specific circuit elements of FIG. 29, an overview of the operation and the circuit elements is provided. Specific details of the various elements and the overall operation of providing asynchronous serializing/deserializing (serdes) data communication will be described in more detail below. One important function of the routing circuit 2614 as shown in FIG. 29 is to multiplex (i.e. merge) data from a configurable block of a circuit block and a routing circuit of a previous stage of the circuit block functioning as a shift register into the next routing circuit. Another important function of the routing circuit is to demultiplex (i.e. split) data from a routing circuit to either a configurable block of the circuit block with which it is associated or an adjacent routing circuit of the circuit block. These split and merge operations can be selected at the time of configuration, such as through the use of Cfg_M configuration bits provided in a configuration bitstream, as will be described in more detail in reference to FIG. 32. Further, by providing a combined merge/split circuit, a single circuit may be implemented throughout a device and configured to perform either the merge function or the split function. Such an architecture of common elements, including circuit blocks having routing circuits which may be programmed as either a merge circuit or a split circuit, provide flexibility in implementing circuits in an integrated circuit.

Referring specifically to the circuit elements and operation of the routing circuit of FIG. 29, the routing circuit 2614 includes a transmission endpoint circuit 2100 and a receiver endpoint circuit 2300, each of which is coupled to a serdes circuit 2904. Each routing circuit 2614 may also be controlled by control signals, depending upon whether the routing circuit is configured as a merge circuit or a split circuit. More particularly, each routing circuit may be configured to either load or unload data, as described above in reference to FIG. 27. That is, a plurality of routing circuits may be configured and controlled to receive data in parallel from a source circuit block, and then function as a shift register to shift and output data to a transmission line, or function as a shift register to shift the data received in series and output the data in parallel to a destination circuit block. For example, a first plurality of routing circuits in a source circuit block is configured to receive data in parallel from configuration blocks of the source circuit block, where the bits of the parallel data are simultaneously input to a plurality of routing circuits, and then sequentially shifted out as serial data on a transmission line. The first plurality of routing circuits could be implemented as the plurality of routing circuits 2702 described above, for example. A second plurality of routing circuits in a destination circuit block is configured to receive the serial data from the transmission line, and then output the received data as parallel data to configurable blocks of the destination circuit block. The second plurality of routing circuits could be implemented as the plurality of routing circuits 2706, for example.

In order to accomplish the loading or unloading, each routing circuit must be configured to either be a merge circuit or a split circuit. Unlike command signals which will be described in more detail below, configuration signals are provided to a given routing circuit to configure the routing circuit as a merge circuit or a split circuit and will generally not change during normal operation. However, it should be understood that a configuration bit which selects whether a routing circuit is configured as a merge circuit or a split circuit could be changed, such as through a partial reconfiguration of the integrated circuit, for example. Further, the selection of a routing circuit as being a merge circuit or a split circuit may made using a control signal provided to the routing circuit by way of signal routing network, for example.

Regardless of whether a routing circuit is configured as a merge circuit or a split circuit, the routing circuit will be controlled to function in either a load/unload mode (i.e. a load mode in the case of a merge circuit and an unload mode in the case of a split circuit) or a shift mode. Accordingly, a load control circuit 2906 is coupled to control the loading and unloading of data by the serdes circuit 2904, depending upon whether the routing circuit is configured as a merge circuit or a split circuit. Because the routing circuits 2614 enable the asynchronous transfer of data, a cascade acknowledge circuit 2908 is provided in each routing circuit to generate a cascade acknowledge signal (cascade_ack) for the asynchronous shifting of data by the routing circuits associated with a circuit block. Finally, because the serdes circuit 2904 functions as a half buffer, the data unloaded by the circuit block (i.e. when the circuit block is functioning as a split circuit in an unload mode) is provided to a half buffer 2910 to enable the routing circuit to function as a full buffer.

Before describing the overall configuration and operation of the circuit of FIG. 29, reference is made by way of example to FIGS. 6 and 26 which show an application of the circuit of FIG. 29 and provides context for the signals which are input to and output by the routing circuit 2614. That is, as shown in FIG. 6, a plurality of isolated circuit blocks 602 are arranged to communicate with each other. The circuit blocks 602 are isolated from each other by the routing circuits 2614 of the interface portion 2612 shown in FIG. 26, where the routing circuits enable the communication of data with any adjacent circuit block on any side of a given circuit block. That is, data may be routed by programmable interconnect points according to the architecture of FIG. 15, for example. The input data Din (or Di<1:0> when converted to dual rail data by a transmission endpoint circuit) is loaded to the routing circuits from configurable blocks of the circuit block, where a Din bit may be a bit of a plurality of parallel bits input to a plurality of routing circuits. Similarly, the output data Do<1:0> (or Dout when converted to single rail data by a receiver endpoint) which is unloaded from the routing circuit to configurable blocks of the circuit block may be output as parallel data by a plurality of routing circuits.

The circuit of FIG. 29 will now be described in conjunction with FIGS. 30-33, where details of the load control circuit 2906 will be further described in more detail in reference to FIGS. 30 and 31, and details of the serdes circuit 2904 will be further described in more detail in reference to FIG. 32. An example of a plurality of routing circuits enabling the transmission of four-bit data will then be described in reference to FIG. 33.

It should be understood that the transmission endpoint circuit 2100 described in detail above in reference to FIGS. 21 and 22 enables the routing circuit 2614 to receive single ended input data Din and generate dual rail data Di<1:0>. The dual rail data may then be shifted in a plurality of routing circuits implemented as a shift register, and transmitted on the pipelined transmission line 2704 as described in reference to FIGS. 20 and 27. In a routing circuit configured as a split circuit, data may be received from the pipelined transmission line 2704, and then unloaded by the receiver endpoint circuit 2300 (for each of the routing circuits of another plurality of routing circuits implemented as shift register) as single ended data which is then provided to configurable blocks of the circuit block. That is, the data received by the destination circuit block from a routing circuit of the destination circuit block is provided by local interconnect portion 2610 to the programmable portion 2608 of a configurable block, as shown in FIG. 26. The programmable portion 2608 may comprise configurable resources, which may receive a clock signal as described for example in FIGS. 13 and 14. As should be apparent, the various configurable blocks 2602 may synchronously communicate data within the circuit block using the local interconnect portions 2610 and one or more clock signals routed to or generated by the configurable blocks.

As set forth above in reference to FIG. 27, each routing circuit may be configured to load data from configurable circuits of a circuit block or unload data to configurable circuits of a circuit block based on Cfg_M signal which indicates whether the routing circuit will be implemented as a merge circuit to load input data (Din) or a split circuit to unload output data (Dout). The Cfg_M signal may be provided by configuration bits of a configuration bitstream, for example. A single, independent Cfg_M signal may be provided to each routing circuit 2614. Alternatively, groups of routing circuits 2614 may receive the same Cfg_M signal. For example, when implementing a circuit for transmitting 32-bit data, groups of 32 routing circuits may receive the same Cfg_M signal.

In additional to receiving the configuration signal Cfg_M, each routing circuit will also receive command signals. That is, while a configuration signal is provided by a configuration bit stored in a configuration memory cell, for example, a command signal is provided by a control circuit of the integrated circuit to dynamically control the operation of the routing circuit. Command signals may be provided to a circuit block from a configurable block of the circuit block or from another circuit block. A first command signal is a load control signal (Load_ctr). Depending upon the state of the load control signal, the routing circuit will either load or unload data or shift data. That is, when the routing circuit is configured as a merge circuit and the Load_ctr signal is a high, the routing circuit will load input data (Din) from the transmission endpoint circuit 2100 to the serdes circuit 2906. Conversely, when the routing circuit is configured as a split circuit and the Load_ctr signal is an active high, the routing circuit will unload data as output data Dout from the receiver endpoint circuit 2300 to configurable blocks of the circuit block.

In contrast, when the Load_ctr signal is low, the routing circuit will function to shift data. More particularly, each routing circuit will enable asynchronously shifting data to another routing circuit in response to a cascade acknowledge signal. Except for the first routing circuit in a plurality of routing circuits, data is received from another routing circuit when functioning in a shift mode. Further, when in a shift mode, the last routing circuit (in a plurality of routing circuits which load data) outputs the data to a pipelined transmission line for routing the data to another circuit block 602. Accordingly, the load control circuit receives the Chain_end signal indicating that the routing circuit is the last routing circuit in a plurality of routing circuits used for shifting the loaded data (e.g. such as the last routing circuit 2614N of the plurality of routing circuits 2702) or the first routing circuit in a plurality of routing circuits used for shifting data to be unloaded (e.g. such as the first routing circuit 2614A of the plurality of routing circuits 2706). A cascade acknowledge circuit 2908 is also used to enable asynchronously shifting data within a plurality of routing circuits when in the shift mode. As will be described in reference to FIG. 33, the cascade acknowledge signal is used as a Load_ctr signal to asynchronously shift data through a plurality of routing circuits functioning as a shift register.

When implementing the routing circuit 2614 as a merge circuit, dual rail input data Di<1:0> (generated from the input data bit Din by the transmission endpoint circuit 2100) is coupled to the serdes circuit 2904. An acknowledge output (Ackout) signal is coupled from the serdes circuit 2904 to the transmission endpoint circuit 2100 to enable the asynchronous communication of the data from the transmission endpoint circuit 2100 to the serdes circuit 2904. It should be noted that each of a plurality of the routing circuits 2614 will receive a Din bit in response to an inverted load (Load_b) signal generated by the load control circuit 2906.

More particularly, the load control circuit 2906 will enable loading of the input data Din before it is shifted by the routing circuit operating as a merge circuit in a shift mode. The load control circuit 2906 comprises a load signal generator 2922 for generating an inverted load signal (Load_b) in response to a top (Top) signal and a bottom (Bot) signal. The load signal generator 2922 is shown in more detail in FIG. 30, which functions according to the state inputs Y1 and Y2 and the Top and Bot signals as set forth in the state machine diagram of FIG. 31. An inverter 2926 is coupled to the gate of a transistor 2928 which receives Load_ctr signal at a first terminal 2930. A second terminal 2932 is coupled to a first terminal 2934 of the transistor 2936 which generates the Bot signal at a second terminal 2938. A NAND gate 2939 coupled to receive the Chain_end signal and an receiver (RX) signal is used to control a transistor 2940 coupled at a first terminal 2942 to receive the Cascade_ack signal and generate the Bot signal at a second terminal 2944 of the transistor 2940. That is, the Top and Bot signals are generated based upon the Load_ctr, Chain_end, Cascade_ack and Rx signals. A transistor 2946 is controlled by an inverter 2948, where a first terminal 2950 of the transistor 2946 is coupled to a ground potential and a second terminal 2952 is coupled to the terminals 2938 of transistor 2936 and terminal 2944 of transistor 2940.

When a plurality of routing circuits are operating as merge circuits in the shift mode, the first register in the plurality of registers will not receive data from another routing circuit, but only transfer data to another routing circuit. Each routing circuit after the first routing circuit will both receive input data and shift data. The last routing circuit in the plurality of routing circuits will output the data to pipelined transmission line 2704. More particularly, the merge circuit 2912 is coupled to receive both the dual rail input data Di<1:0> from a configurable circuit of the circuit block and input data in<1:0> from another routing circuit. The merge circuit will then select one of those two inputs to be output as dual rail half buffer data hb<1:0>. The half buffer data hb<1:0> output by the merge serdes circuit 2904 when shifting data must be routed to the half buffer circuit 2910 to generate the fully buffered, dual rail output data Do<1:0>. Accordingly, when in a shift register mode in response to the load control signal, the serdes circuit 2904 and the half buffer 2910 will shift data to an adjacent routing block. As will be described in more detail, the split circuit 2914 enables the transfer of data received by way of the pipelined transmission line 2704 to either another routing circuit during a shift mode or to internal circuits of the circuit block during an unload mode.

The load control signal Load_ctr is used to indicate whether the routing circuit is operating to load data or unload data in a load/unload mode. When operating in the load/unload mode, the Chain_end signal (which relates to a shift mode as will be described in more detail below) is low, turning on the transistor 2928 to drive the Top signal based upon the Load_ctr signal. When the routing circuit is functioning as a merge circuit for loading data, the receive (RX) signal is low (i.e. indicating that the routing circuit is functioning as a merge circuit to load data and not functioning as a split circuit to unload data), a high output is generated at the output of the NAND gate 2939. The high output of the NAND gate 2939 turns on the transistor 2940 and turns off transistor 2946 to couple the Cascade_ack signal as the Bot signal. When the routing circuit is the last circuit of a plurality of routing circuits and the routing circuit is operating as a merge circuit, inverter 2926 receives an active high Chain_end signal. The active high Chain_end signal turns on transistor 2936 and turns off transistor 2928, thereby driving the Top signal to the value of the terminal 2938. Accordingly, for the last routing circuit of a chain of routing circuits implemented as merge circuits, the value of the terminal 2938 will be the value of the Cascade_ack signal.

When the routing circuit is configured as a split circuit and the circuits are controlled to unload data based upon a high Load_ctr signal, the routing circuit will function to unload data. The operation of loading and unloading data will be described in more detail in reference to FIG. 32. When the routing circuit is implemented as a split circuit and the routing circuits are controlled to shift data, the RX signal is high. Accordingly, for a routing circuit configured as a split circuit at the end of a chain for unloading data and which receives a high Chain_end signal and the Rx signal, the output of the NAND gate 2938 is low, turning off the transistor 2940 and driving the Bot signal low by turning on transistor 2946.

When the routing circuit is operating in a shift mode in a routing circuit functioning as either a split circuit or a merge circuit, the output of the NAND gate 2938 is high, except for a split circuit which is implemented at the end of a chain. In that case, the transistors 2936 and 2940 are turned on, driving the Top and Bot signals to the value of the Cascade_ack signal generated by the cascade acknowledge circuit 2908. In particular, a "neither or" (NOR) gate 2960 is coupled to receive the dual rail input data Di<0> and Di<1> at its inputs. The output of the NOR gate 2960 is coupled to an input of a multiplexer 2962 which is also coupled to receive an inverted acknowledge (ackout_b) signal from the receiver endpoint circuit 2300. The multiplexer 2962 is controlled by the Cfg_M signal. Accordingly, when the routing circuit is implemented as a merge circuit, the multiplexer 2962 selects the output of the NOR gate 2960 as the Cascade_ack signal. When the routing circuit is implemented as a split circuit, the inverted acknowledge signal ackout_b signal will be selected by the multiplexer 2962 as the Cascade_ack signal.

Figure 30:
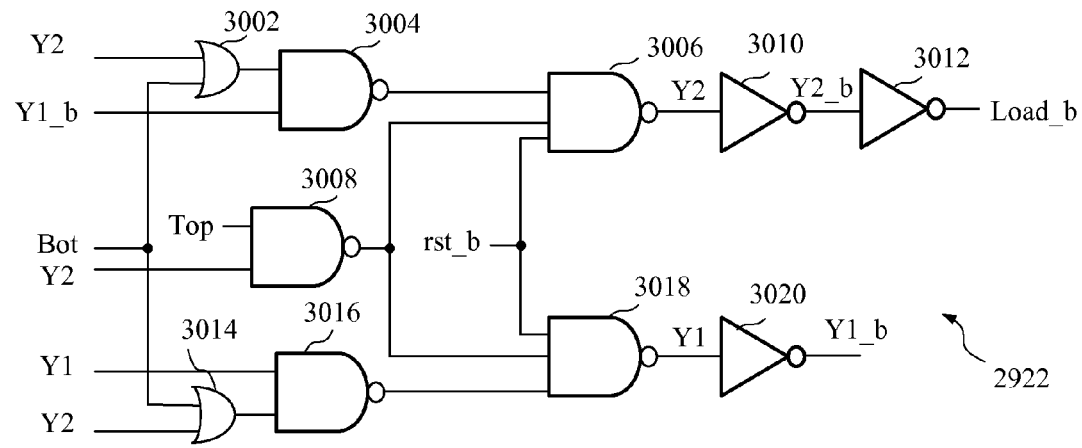
FIG. 30 is a block diagram of the load signal generator 2922 implemented in the circuit of FIG. 29 according to an embodiment.
Figure 31:
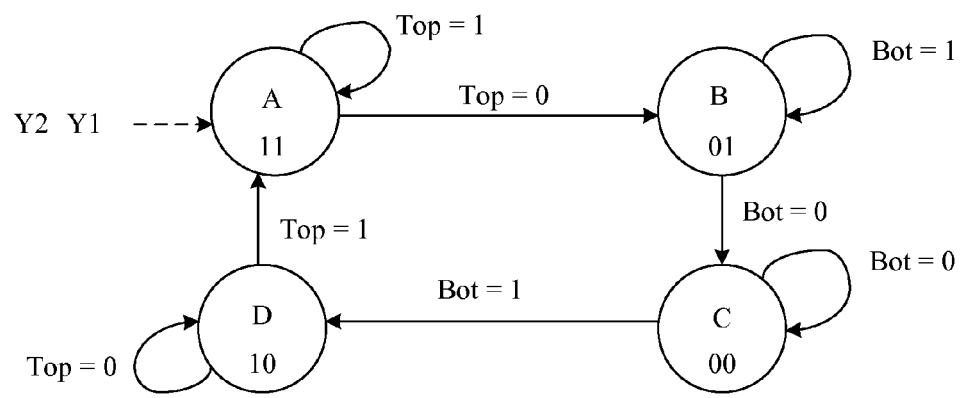
FIG. 31 is a state diagram for implementing the load signal generator 2922 according to an embodiment.

Turning now to FIGS. 30 and 31, a block diagram of the load signal generator 2922 and a corresponding state diagram for implementing the circuit of FIG. 29 is shown. The load signal generator 2922 receives the Bot signal and Top signal, as well as state inputs Y1 and Y2 according to the state diagram of FIG. 31. An OR gate 3002 is coupled to receive the Y2 signal and the Bot signal and generates an output coupled to a NAND gate 3004. The output of the NAND gate 3004 is coupled to a NAND gate 3006. The NAND gate 3006 also receives an output from a NAND gate 3008 and an inverted reset signal (rst_b). The NAND gate 3008 is coupled to receive the Top signal and the Y2 signal. The Y2 signal is also coupled to an inverter 3010 to generate an inverted Y2 signal (Y2_b), which is coupled to an inverter 3012 to generate the inverted load signal Load_b.

An OR gate 3014 is coupled to receive the Y2 signal and the Bot signal. A NAND gate 3016 is coupled to receive the output of the NOR gate 3014 and the Y1 signal. The output of the NAND gate 3016 is the Y1 signal which is coupled to a NAND 3018 which generates the Y1 signal. An inverter 3020 is coupled to the output of the NAND gate 3018 to generate the inverted Y1 signal (Y1_b). Accordingly, the inverted load signal Load_b is generated based upon the Top and Bot signals generated by the control circuit 2906 according to the state signal Y1 and Y2 as shown in FIG. 31.

Figure 32:
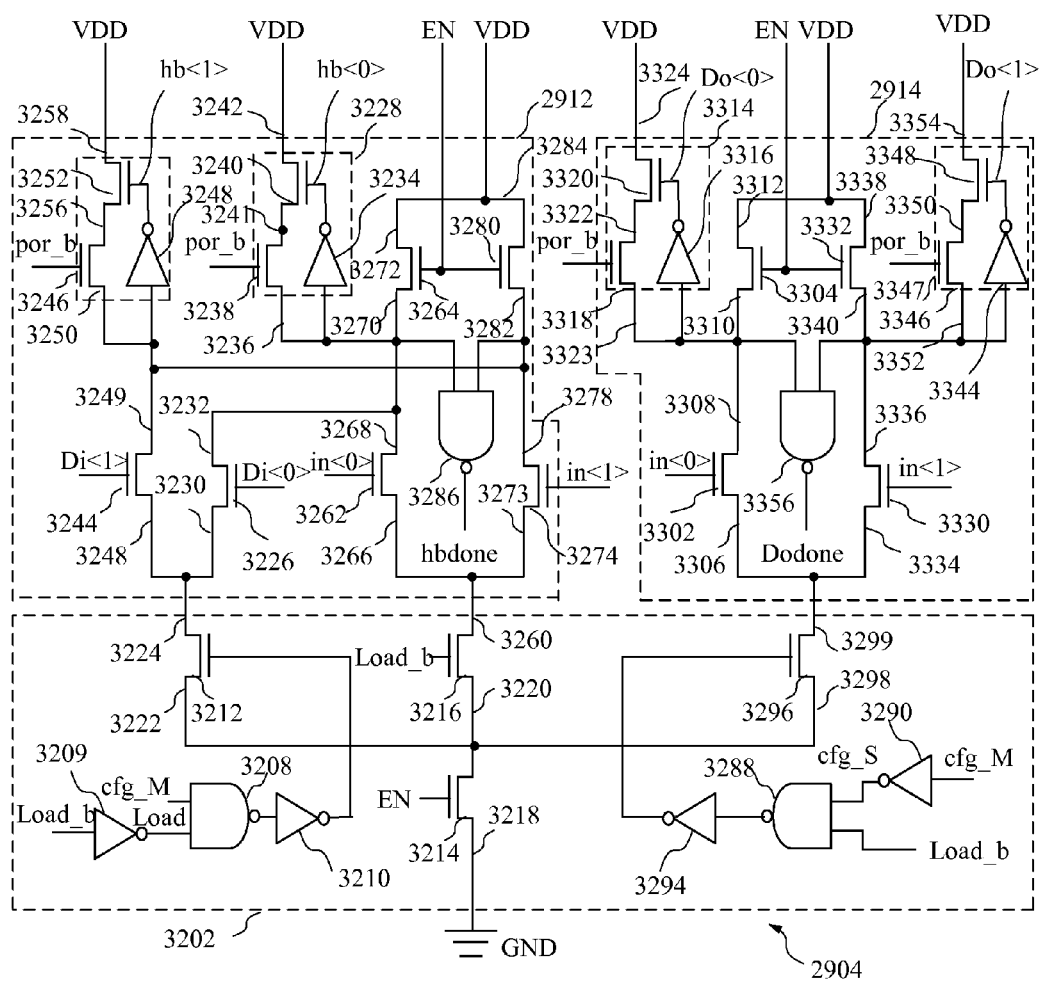
FIG. 32 is a block diagram of a merge/split circuit 2904 of the routing circuit 2614 of FIG. 29 according to an embodiment.

Turning now to FIG. 32, the serdes circuit 2904 according to one embodiment is shown. The serdes circuit 2904 includes a control circuit 3202 coupled to each of the merge circuit 2912 and the split circuit 2914. A NAND gate 3208 receives the Load signal (by way of an inverter 3209 receiving the Load_b signal) and a configuration signal Cfg_M which indicates that the serdes circuit 2904 should operate as a merge circuit. While the load signal comprises a dynamic signal, the Cfg_M signal may be programmable by a configuration bit of a configuration bitstream. The output NAND gate 3208 is coupled to an inverter 3210 which controls a transistor 3212. A transistor 3214 and a transistor 3216 are coupled in series as shown to enable a portion of the merge circuit 2912. More particularly, the transistor 3214 has a first terminal 3218 coupled to a ground potential and a second terminal 3220 coupled to a first terminal 3222 of the transistor 3212 to enable loading the input data Di<1:0>.

Accordingly, if the serdes circuit 2904 is to be implemented as a merge circuit and is operating in a load mode, both Cfg_M and load signals will be high, leading to a low signal at the output of the NAND gate 3208 and a high signal at the gate of the transistor 3212. The high signal which turns on transistor 3212 enables the paths for generating hb<1:0>. More particularly, a terminal 3224 of the transistor 3212 is coupled to a first path having a transistor 3226 and an output circuit 3228. The terminal 3224 of the transistor 3212 is also coupled to a terminal 3230 of the transistor 3226 and a terminal 3232 is coupled to the output circuit 3228 to generate the hb<0> output based upon the Di<0> signal coupled to the gate of the transistor 3226. The output circuit 3228 includes an inverter 3234 having an input coupled to a terminal 3236 of the transistor 3238. A terminal of transistor 3238 is coupled to a terminal of the transistor 3240 at a node 3241. The transistor 3240 also receives a voltage potential VCC at another terminal 3242. Accordingly, a value of hb<0> will be generated at an output of the inverter 3234 depending upon the value of Di<0>.

Circuit elements are also provided for generating the hb<1> signal. In particular, the terminal 3224 of the transistor 3212 is coupled a second path having a transistor 3244 and an output circuit 3246. The terminal 3224 of the transistor 3212 is coupled to a terminal 3248 of the transistor 3244. The output circuit 3246 includes an inverter 3248 and transistors 3250 and 3252 coupled in series at a node 3256. Transistor 3252 also receives the voltage potential VCC at another terminal 3258. Accordingly, depending upon the value of Di<1>, a value of hb<1> will be generated at an output of the inverter 3248.

When the serdes circuit 2912 is controlled to operate in a shift mode rather than a load mode, the load signal is low, turning off transistor 3212, and the Load_b signal is high, turning on transistor 3216. In the shift mode, input data in<1: 0> is coupled to outputs hb<1:0>. As described above in reference to FIG. 28, in<1:0> represents input data received from an adjacent routing circuit in a shift mode. A terminal 3260 of the transistor 3216 is coupled to a first path comprising a series of resistors 3262 and 3264. The first path enables the shifting of the in<0> signal as output data hb<0> of the routing circuit by way of the output circuit 3228. The terminal 3260 is also coupled to a first terminal 3266, and a terminal 3268 is coupled to a terminal 3270 of the transistor 3264. A terminal 3272 is coupled to the VDD voltage. The terminal 3260 is coupled to a second path at a terminal 3273 of a transistor 3274. A terminal 3278 of transistor 3273 is coupled to a transistor 3280 at a terminal 3282. Finally, a terminal 3284 of transistor 3280 is coupled to VDD. The second path enables the shifting of the in<1> data as output data hb<1> of the routing circuit 2904 by way of the output circuit 3246. A NAND gate 3286 is coupled to a node of each of the first and second paths to generate an hbdone signal indicating that the data has been transferred to the output. As should be apparent, the circuit elements enabling the shifting of data are used for both routing circuits configured as merge circuits and routing circuits configured as split circuits.

Finally, the last part of the circuit comprises the split circuit 2914 of the circuit, where the input data in<0> is generated as output data Do<0> and the input data in<1> is generated as output data Do<1>. A portion of the control circuit 3202 includes circuit elements which enable the generation of the output data Do<1:0> when the routing circuit is configured as a split circuit. In particular, a NAND gate 3288 is coupled to receive the Cfg_M signal at an inverter 3290 to generate the Cfg_S signal. The inverted load signal (Load_b) is also provided to an input of the NAND gate 3288. The output of the NAND gate 3288 is coupled to an inverter 3294 which is coupled to control a transistor 3296. The transistor 3296 includes a terminal 3298 coupled to the ground potential by the transistor 3214 and a terminal 3299 coupled to each of two paths for generating the input signal in<1:0> as output data Do<1:0>. Accordingly, when Cfg_M is low (to disable the portion of the circuit coupled to transistor 3224 which enables the routing circuit to function as a merge circuit), Cfg_S is high to enable the portion of the circuit coupled to the transistor 3296 and enable the routing circuit to function as a split circuit.

The terminal 3299 of the transistor 3296 is coupled to a transistor 3302 of a first path, also having a transistor 3304, at a first terminal 3306 of the transistor 3302. The terminal 3308 of the transistor 3302 is coupled to a terminal 3310 of the transistor 3304. A terminal 3312 of the transistor 3304 is coupled to VDD. The node between the transistors 3302 and 3304 is coupled to an output circuit 3314. The output circuit 3314 includes an inverter 3316 which generates the output Do<0> and a series of transistors 3318 and 3320 coupled at a node 3322. An input of the inverter 3316 is coupled to a terminal 3323 of the transistor 3318 and an output of the inverter 3316 is coupled to the gate of the transistor 3320. A terminal 3324 of the transistor 3320 is coupled to VDD.

The terminal 3299 of the transistor 3296 is also coupled to a transistor 3330 of a second path, also having a transistor 3332, at a first terminal 3334 of the transistor 3330. A terminal 3336 of the transistor 3330 is coupled to a terminal 3340 of the transistor 3332. A terminal 3338 of the transistor 3332 is coupled to VDD. The node between the transistors 3330 and 3332 is coupled to an inverter 3344 of an output circuit 3346. The inverter 3344 generates the output Do<1>. The output circuit 3346 also includes a series of transistors 3347 and 3348 coupled at a node 3350. An input of the inverter 3344 is coupled to a terminal 3352 of the transistor 3347 and an output of the inverter 3344 is coupled to the gate of the transistor 3348. A terminal 3354 of the transistor 3348 is coupled to VDD. The second path enables the transferring of the in<1> data as output data Do<1> of the routing circuit 2904 by way of the output circuit 3346. A NAND gate 3356 is coupled to a node of each of the first and second paths to generate a Dodone signal indicating that the data has been transferred to the output.

Figure 33:
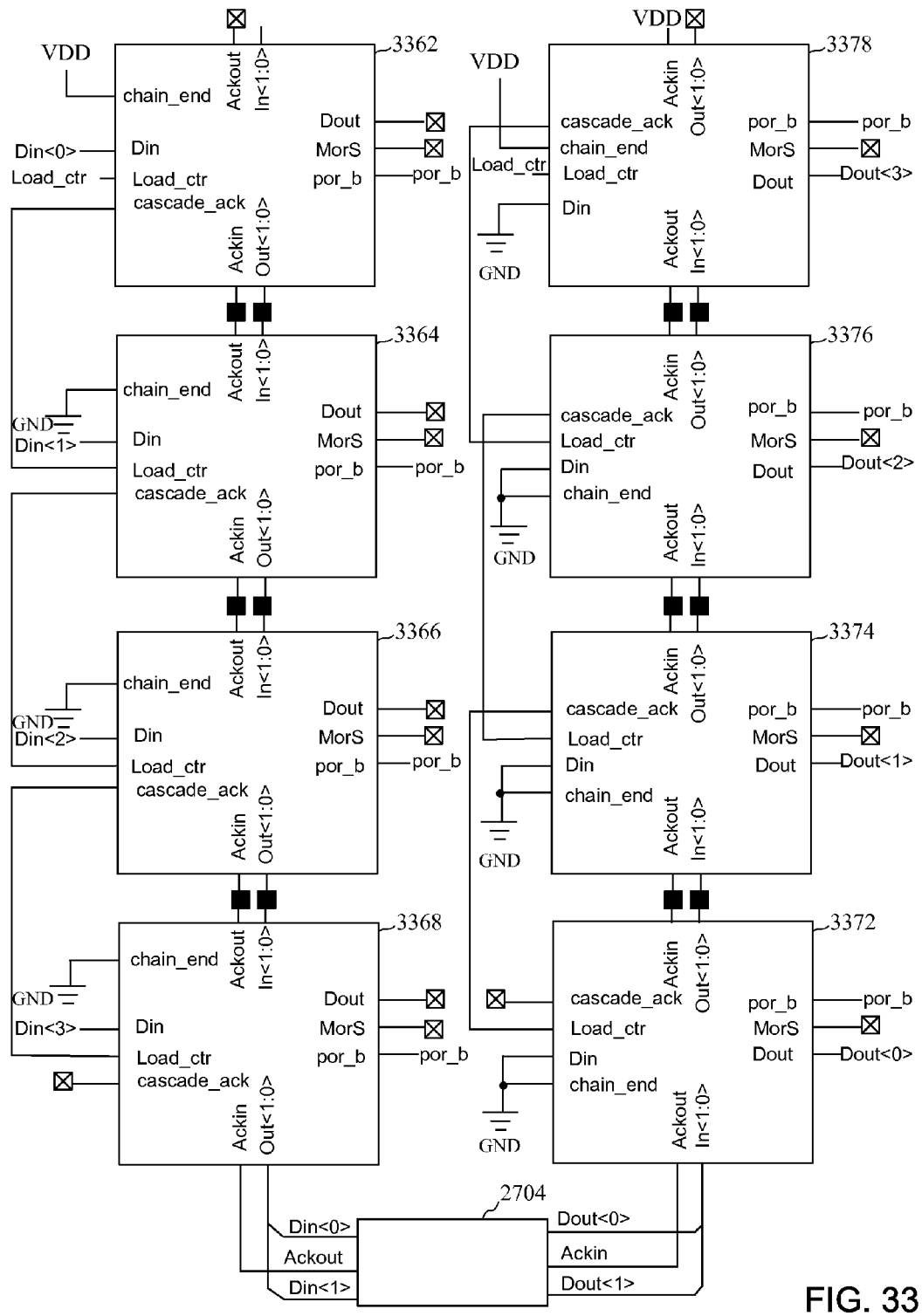
FIG. 33 is a block diagram of a circuit showing the communication of 4-bit data using the circuits of FIGS. 26-32 according to an embodiment.

A configuration of routing circuits will now be described to show the transfer of multi-bit data. According to the exemplary arrangement of FIG. 33, a four bit input Din<3:0> is loaded as parallel data to the routing circuits 3362-3368. While the routing circuits of FIG. 33 are separately numbered for purposes of describing the transfer of multi-bit data, it should be understood that each of the routing circuits is implemented as a routing circuit 2614 described in reference to FIGS. 26-32. The first routing circuit of the plurality of routing circuits which generates output data (i.e. routing circuit 3362) receives the VGG reference signal at a chain_end input, while the chain_end input of each of the other routing circuits for loading data is pulled to ground. The Cascade_ack output of each routing circuit is coupled to a Load_ctr input of the routing circuit to which data is shifted in the plurality of routing circuits. Accordingly, when implemented as a merge circuit, the cascade acknowledge signal generated by the cascade acknowledge circuit 2908 will depend upon the output of the transmission endpoint circuit 2100.

As described above in reference to the FIG. 32, the routing circuits 3362-3368 are configured as "merge" circuits by providing a high reference voltage (VGG) to the Cfg_M input, where the 4 bits Din<3:0> that are input to the routing circuits 3362-3368 are then converted to dual rail data. Each of the two-bit data is then serially cascaded to the pipelined transmission line 2704. Data output from the routing circuit 3368 is provided to the pipelined transmission line 2704.

The dual rail data Dout<1:0> received at the input In<1:0> of the routing circuit 3372 from the pipelined transmission line 2704 is then cascaded through the routing circuits 3372-3378. Because the routing circuits 3372-3378 are configured as split circuits by pulling the Cfg_M input to ground, the dual rail data of a given routing circuit is then converted to single rail data and output by the routing circuit as Dout<3:0>. The load output of each routing circuit is coupled to a Cascade_ack input of the routing circuit to which data is transferred. The last routing circuit 2614N receives the VGG reference signal at a chain_end input, while the chain_end input and the data in (DIN) input of each of the other routing circuits is pulled to ground. While the transfer of 4-bit data is shown by way of example, it should be understood that data having other data widths may be transferred according to the various embodiments.

Flow charts associated with methods of asynchronously routing data are now described. The methods may be implemented using any of the circuits of FIGS. 1-33 as described, or other suitable circuits. While certain steps of the methods are provided, it should be understood that additional details related to the steps or additional steps which may be performed as described in reference to FIGS. 1-33. Further, while the methods of FIGS. 34-36 are shown in separate flow charts for convenience, the methods may be implemented together.

Figure 34:
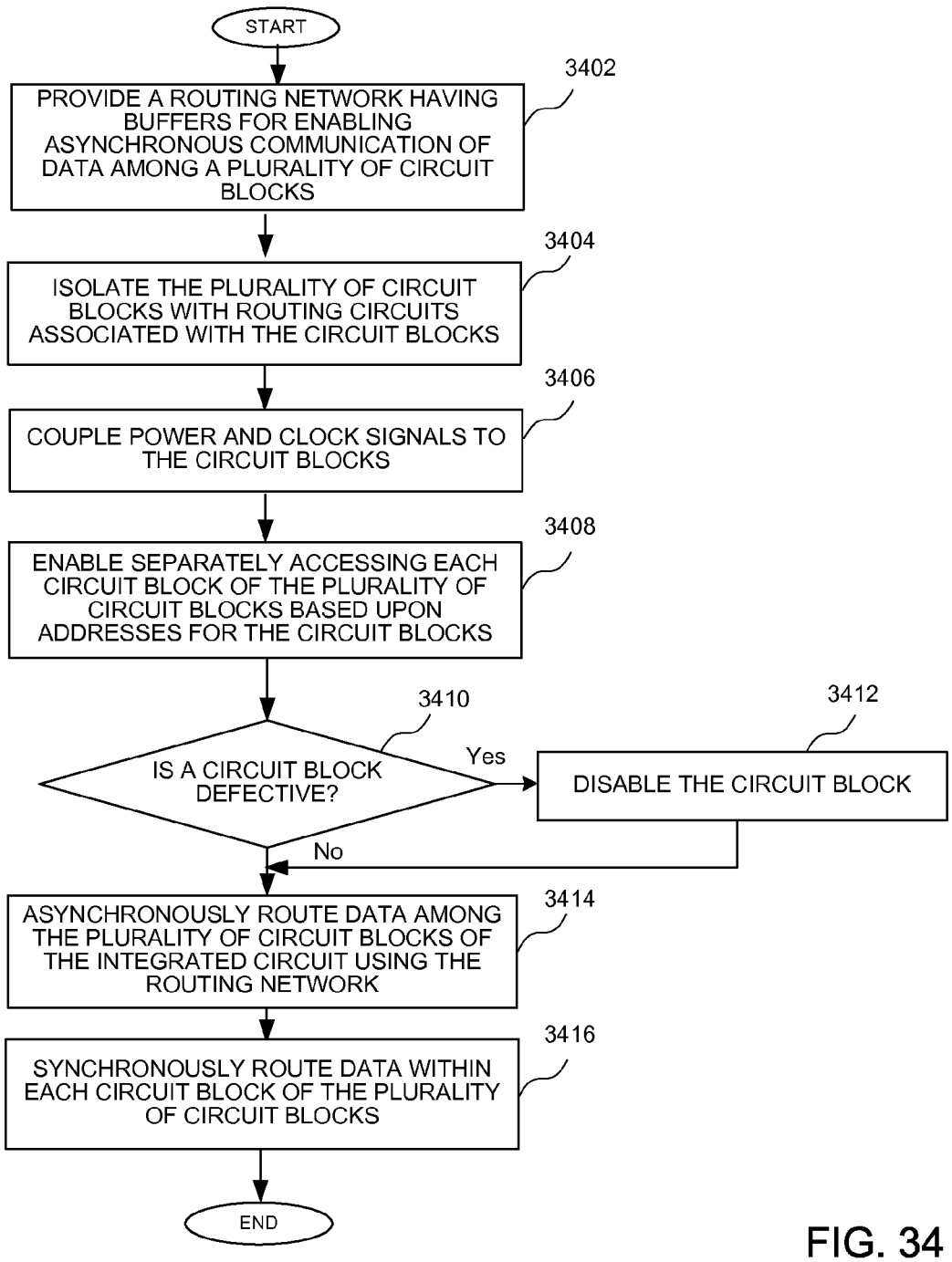
FIG. 34 is a flow chart showing a method of enabling data communication in an integrated circuit according to an embodiment.

Turning first to FIG. 34, a flow chart shows a method of enabling data communication in an integrated circuit according to an embodiment. In particular, a routing network having buffers for enabling asynchronous communication of data among a plurality of circuit blocks is provided at a step 3402. The plurality of circuit blocks are isolated with routing circuits associated with the circuit blocks at a step 3404. Power and clock signals are coupled to the circuit blocks at a step 3406. Alternatively, clock signals could be generated within the circuit blocks. Each circuit block of the plurality of circuit blocks is enabled to be separately accessed based upon addresses for the circuit blocks at a step 3408. It is then determined whether a circuit block is defective at a step 3410. If so, the circuit block is disabled a step 3412. Data is asynchronously routed among the plurality of circuit blocks of the integrated circuit using the routing network at a step 3414. Data is then synchronously routed within each circuit block of the plurality of circuit blocks at a step 3416.

Turning now to FIG. 35, a flow chart shows a method of routing data in circuit blocks of an integrated circuit according to an embodiment. In particular, a plurality of circuit blocks is provided at a step 3502, each circuit block of the plurality of circuit blocks comprising programmable resources. As described above, the programmable resources could be configurable logic blocs, BRAMS, processors, or DSPs, for example. A routing network coupled to the plurality of circuit blocks is configured, where the routing network has a plurality of programmable interconnect points comprising buffers which enable asynchronous communication at a step 3504. Signal ended data is converted to dual rail data by a transmission endpoint circuit at a step 3506. Asynchronous communication of data between the transmission endpoint and a receiver endpoint is enabled at a step 3508. The dual rail data is asynchronously received at the receiver endpoint at a step 3510. The dual rail data is converted to single ended data at a step 3512. The data is synchronously routed within a circuit block at a step 3516.

Turning now to FIG. 36, a flow chart showing a method of asynchronously routing data in an integrated circuit according to an embodiment. In particular, a plurality of circuit blocks is provided at a step 3602, wherein each circuit block of the plurality of circuit blocks has programmable resources. A plurality of data bits is loaded in parallel from internal circuits of a first circuit block of the plurality of circuit blocks to a plurality of routing circuits associated with the circuit block at a step 3604. The data is then shifted using the plurality of routing circuits of the circuit block at a step 3606. The data is serially routed by way of a routing network to enable the asynchronous transfer of data to a second circuit block of the plurality of circuit block at a step 3608. The data is then shifted into the second circuit block using a plurality of routing circuits of the second circuit block at a step 3610. The plurality of data bits is unloaded in parallel from the plurality of routing circuits of the second circuit block at a step 3612. The data is then synchronously routed within each circuit block of the plurality of circuit blocks at a step 3614.

The circuits and methods described above provide an improved implementation and performance of an integrated circuit device. One benefit of the circuits and methods is that the same architecture may be used for both high performance markets and low cost markets. Developers of conventional devices may often implement different architecture types for different markets. However, with rising manufacturing costs, it would be beneficial to use the same architecture to deliver a required performance and cost. For example, if reduced cost were the main goal and most circuits of an integrated circuit runs at 50 MHz, the global routing can multiplex more than 20 data lines and send them to another circuit block, where the circuit blocks are fully utilized. If operating at 500 MHz is a performance goal, the circuit blocks will be underutilized and a lower level of time multiplexing occurs. Accordingly, the circuits set forth above enable a trade-off of area and speed in a single device, where the tradeoff may be easily controlled by configuration bits of a configuration bitstream.

Further, it is possible to group signals in a clock domain of lower frequencies in a source circuit block, serialize them, send them over a fast media, and finally de-serialize the data at the edge of destination circuit block. Accordingly, fewer interconnect resources are used to deliver the same bandwidth on a programmable logic device. Further, because the use of a global routing network, less routing resources are required for each circuit block, which in turn translates to higher area and power efficiency for integrated circuit.

The size of a circuit block may be determined by the speed of the routing circuits within the circuit block. Because the routing provided by the routing circuits is pipelined, it will be scalable as the number of circuit blocks 602 and the size of the integrated circuit increases. As global communication and routing is moved to inter-circuit block routing, intra-circuit block routing is generally reduced, leading to smaller circuit blocks 602. Accordingly, the size of configurable circuits, such as CLBs, could be approximately 15%-35% smaller than configurable circuit implemented using conventional routing. Such a reduction in the size of configurable circuits would translate into more configurable circuits per circuit block and therefore higher area-efficiency.

It can therefore be appreciated that the new and novel integrated circuit and method of implementing an integrated circuit has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. An integrated circuit enabling asynchronous data communication, the integrated circuit comprising:
   a plurality of circuit blocks, each circuit block of the plurality of circuit blocks comprising programmable resources and a plurality of routing circuits; and
   a routing network coupled to each circuit block of the plurality of circuit blocks, the routing network enabling asynchronous data communication with the plurality of circuit blocks;
   wherein each routing circuit of the plurality of routing circuits is controllable to load data from a circuit block of the plurality of circuit blocks in parallel or unload data to the circuit block of the plurality of circuit blocks in parallel in a first mode and to shift the data loaded from the circuit block in the first mode serially between the plurality of routing circuits of the circuit block in a second mode; and
   wherein each circuit block of the plurality of circuit blocks synchronously processes data received from the routing network by way of the plurality of routing circuits.

2. The integrated circuit of claim 1, wherein each circuit block of the plurality of circuit blocks comprises a power gating circuit enabling coupling power to the circuit block.

3. The integrated circuit of claim 2, wherein each circuit block of the plurality of circuit blocks receives a reference voltage signal of a plurality of reference voltage signals by way of the power gating circuit.

4. The integrated circuit of claim 1, wherein each circuit block of the plurality of circuit blocks receives a clock signal of a plurality of clock signals.

5. The integrated circuit of claim 1, wherein each circuit block of the plurality of circuit blocks is separately addressable.

6. The integrated circuit of claim 1, wherein each circuit block of the plurality of circuit blocks comprises a plurality of configurable blocks.

7. The integrated circuit of claim 1, further comprising selection circuitry coupled to disable a circuit block of the plurality of circuit blocks.

8. The integrated circuit of claim 1, wherein at least one circuit block of the plurality of circuit blocks operates on a same clock domain as at least one other circuit block of the plurality of circuit blocks.

9. An integrated circuit enabling asynchronous data communication, the integrated circuit comprising:
    a plurality of circuit blocks, each circuit block of the plurality of circuit blocks comprising programmable resources and a plurality of routing circuits; and
    a routing network coupled to each circuit block of the plurality of circuit blocks, the routing network enabling asynchronous data communication with the plurality of circuit blocks;
    wherein each routing circuit of the plurality of routing circuits is controllable to load data from a circuit block of the plurality of circuit blocks in parallel or unload data to the circuit block of the plurality of circuit blocks in parallel in a first mode and to shift the data loaded from the circuit block in the first mode serially between the plurality of routing circuits of the circuit block in a second mode; and
    wherein each routing circuit of the plurality of routing circuits enables asynchronous communication with configurable blocks of the circuit blocks.

10. The integrated circuit of claim 9, wherein the routing network enables wave pipelining between circuit blocks receiving a common clock signal.

11. The integrated circuit of claim 9, wherein the plurality of routing circuits enables clockless time multiplexing of data coupled to the circuit block.

12. The integrated circuit of claim 9, wherein each routing circuit comprises a transmission endpoint circuit and a receiver endpoint circuit.

13. The integrated circuit of claim 9, wherein each circuit block of the plurality of circuit blocks comprises a power gating circuit enabling coupling power to the circuit block.

14. The integrated circuit of claim 13, wherein each circuit block of the plurality of circuit blocks receives a reference voltage signal of a plurality of reference voltage signals by way of the power gating circuit.

15. The integrated circuit of claim 9, wherein each circuit block of the plurality of circuit blocks is separately addressable.

16. A method of routing data in an integrated circuit, the method comprising:
    configuring a routing network having buffers for enabling asynchronous communication of data between a plurality of circuit blocks;
    wherein each circuit block of the plurality of circuit blocks has a plurality of routing circuits controllable to load data from a circuit block of the plurality of circuit blocks in parallel or unload data to the circuit block of the plurality of circuit blocks in parallel in a first mode and to shift the data loaded from the circuit block in the first mode serially between the plurality of routing circuits of the circuit block in a second mode;
    asynchronously routing data, by way of the plurality of routing circuits, between the plurality of circuit blocks of the integrated circuit using the routing network; and
    synchronously routing data within each circuit block of the plurality of circuit blocks.

17. The method of claim 16, further comprising loading a configuration bitstream having configuration bits for configuring the buffers to function as asynchronous buffers.

18. The method of claim 16, further comprising:
    isolating each circuit block of the plurality of circuit blocks with the plurality of routing circuits; and
    asynchronously routing the data in the plurality of routing circuits.

19. The method of claim 16, further comprising providing, for each circuit block of the plurality of circuit blocks, a selection circuit for disabling the circuit block.

20. The method of claim 16, further comprising accessing a circuit block of the plurality of circuit blocks using an address for the circuit block.

\* \* \* \* \*